US012701714B2

(12) United States Patent
Lee et al.

(10) Patent No.: US 12,701,714 B2
(45) Date of Patent: Aug. 4, 2026

(54) FERROELECTRIC RANDOM ACCESS MEMORY DEVICE AND METHOD

(71) Applicant: TAIWAN SEMICONDUCTOR MANUFACTURING COMPANY, LTD., Hsinchu (TW)

(72) Inventors: I-Che Lee, Taipei (TW); Yen-Chieh Huang, Changhua (TW); Huai-Ying Huang, Taipei (TW); Kai-Wen Cheng, Taichung (TW); Yu-Ming Lin, Hsinchu (TW); Chung-Te Lin, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 404 days.

(21) Appl. No.: 18/206,114

(22) Filed: Jun. 6, 2023

(65) Prior Publication Data
US 2024/0414924 A1      Dec. 12, 2024

(51) Int. Cl.
*H10B 51/30*          (2023.01)
(52) U.S. Cl.
CPC .................................... *H10B 51/30* (2023.02)
(58) Field of Classification Search
CPC .... H10B 51/30; H10D 30/701; H10D 64/033; H10D 64/689
See application file for complete search history.

(56) References Cited

U.S. PATENT DOCUMENTS

| | | | |
|---|---|---|---|
| 9,224,675 B1 * | 12/2015 | DeHaven .......... | H01L 23/53266 |
| 11,508,755 B2 | 11/2022 | Huang et al. | |
| 11,527,649 B1 * | 12/2022 | Huang ................ | H01L 21/2236 |
| 11,792,996 B2 | 10/2023 | Lin et al. | |
| 12,089,415 B2 * | 9/2024 | Huang ................... | H10B 51/30 |
| 12,167,609 B2 * | 12/2024 | Dai .................... | H10D 30/6755 |
| 2008/0157155 A1 | 7/2008 | Wang | |
| 2013/0161790 A1 | 6/2013 | Kikuchi et al. | |

(Continued)

*Primary Examiner* — Bitew A Dinke
(74) *Attorney, Agent, or Firm* — NZ Carr Law Office

(57) ABSTRACT

Embodiments of the present disclosure provide a method including forming a gate electrode over a substrate, forming a ferroelectric layer over the gate electrode, forming a channel layer over the ferroelectric layer, forming a capping layer over the channel layer, wherein the capping layer includes one or more of $CeO_x$, $BeO_x$, $InO_x$, $GaO_x$, $AlO_x$, $SnO_x$, $VO_x$, $WO_x$, $TiO_x$, $ZrO_x$, $NbO_x$, $HfO_x$, $SiO_x$, $TaO_x$, a binary metal oxide based on any combination of the preceding metal oxides, or a ternary metal oxide based on any combination of the preceding metal oxides, annealing, after forming the capping layer, at a temperature less than 350° C., forming a dielectric layer over the capping layer, and forming a source contact and a drain contact in the dielectric layer.

20 Claims, 23 Drawing Sheets

(56) References Cited

U.S. PATENT DOCUMENTS

| | | | |
|---|---|---|---|
| 2014/0327139 A1* | 11/2014 | Yu | H01L 23/485 |
| | | | 438/653 |
| 2022/0059618 A1* | 2/2022 | Hsu | H10B 63/80 |
| 2022/0158087 A1* | 5/2022 | Kuo | H10N 50/80 |
| 2022/0254793 A1* | 8/2022 | Huang | H10D 30/6757 |
| 2022/0254794 A1 | 8/2022 | Huang et al. | |
| 2022/0271046 A1* | 8/2022 | Huang | H10D 64/033 |
| 2022/0271047 A1* | 8/2022 | Liao | H01L 21/76876 |
| 2022/0285396 A1* | 9/2022 | Huang | H10D 64/693 |
| 2022/0344513 A1* | 10/2022 | Huang | H10D 30/611 |
| 2022/0352379 A1* | 11/2022 | Lin | H10D 99/00 |
| 2022/0406798 A1* | 12/2022 | Wu | H10D 64/685 |
| 2023/0036606 A1* | 2/2023 | Dai | H10D 30/6755 |
| 2023/0045806 A1* | 2/2023 | Jiang | H10D 30/0415 |
| 2023/0069233 A1* | 3/2023 | Huang | H10D 30/6739 |
| 2023/0143625 A1* | 5/2023 | Huang | H10D 30/701 |
| | | | 257/295 |
| 2023/0145317 A1* | 5/2023 | Huang | H10B 51/20 |
| | | | 257/295 |

* cited by examiner

FERROELECTRIC RANDOM ACCESS MEMORY DEVICE AND METHOD

BACKGROUND

Many modern-day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic and thin film transistor fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
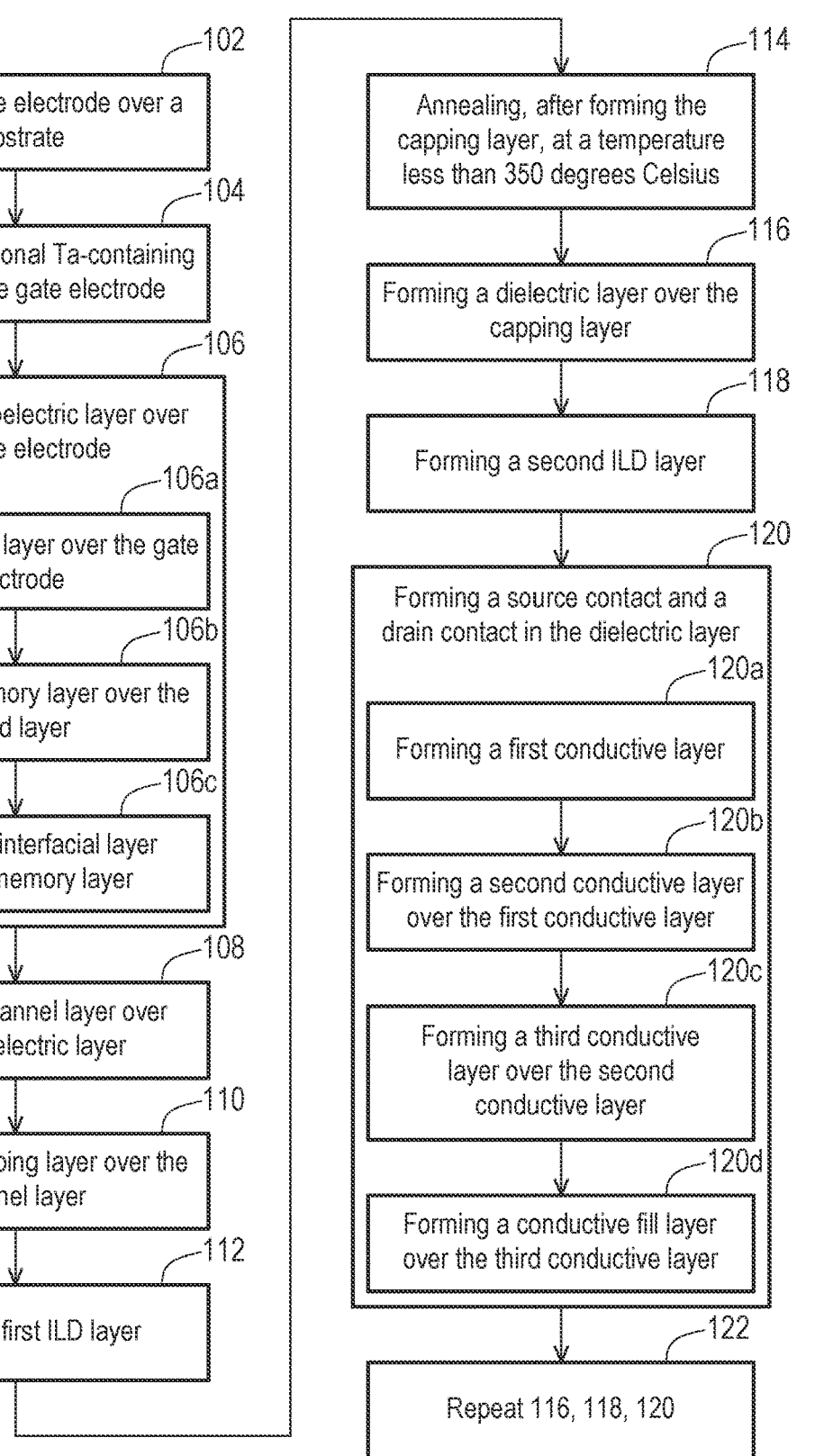
FIG. 1A is a flow chart of a method for manufacturing a semiconductor device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and also may include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing broadly outlines some aspects of embodiments described in this disclosure. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain region(s) may refer to a source or a drain, individually or collectively dependent upon the context.

FIG. 1A is a flow chart of a method 100 for manufacturing a semiconductor device 200 (e.g., a ferroelectric random access memory (FeRAM) device) according to embodiments of the present disclosure. The method 100 is described with reference to FIGS. 2-17, which schematically illustrate various stages of manufacturing the semiconductor device 200. As described in more detail below, the portion of the method 100 of FIGS. 1B-1D, according to different embodiments of the present disclosure, is described with reference to respective embodiments of the semiconductor device 200 shown in FIGS. 18-20.

Figure 2:
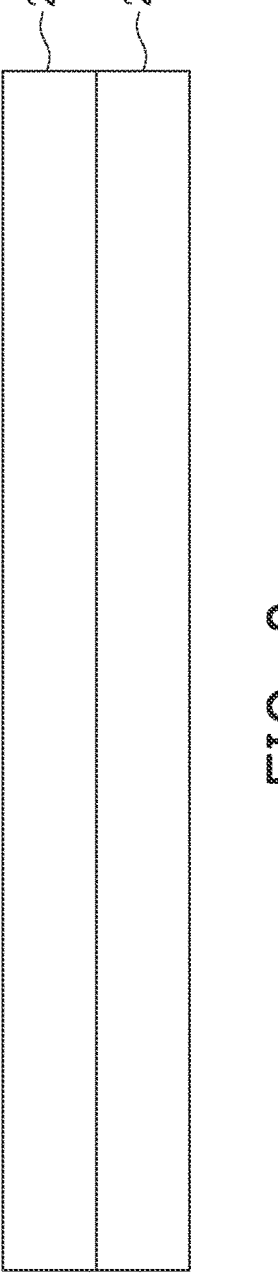
FIGS. 2-17 schematically illustrate various stages of manufacturing a semiconductor device according to embodiments of the present disclosure.

As shown in FIG. 2, at block 102, of the method 100, a gate electrode 204 is formed over a substrate 202. For example, the gate electrode 204 may be in contact with a surface (e.g., a top surface) of the substrate 202. The substrate 202 is provided to form the semiconductor device 200 thereon. The substrate 202 may be any suitable substrate, such as a semiconductor substrate or a silicon-on-insulator (SOI) substrate including an insulator structure. In some embodiments, the gate electrode 204 may be formed over the substrate 202 using a deposition process, such as physical vapor deposition (PVD), chemical vapor deposition (CVD), atomic layer deposition (ALD), direct current sputtering, other suitable processes, and/or combinations thereof. In some embodiments, the gate electrode 204 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode 204 is buried in the substrate 202.

Figure 3:
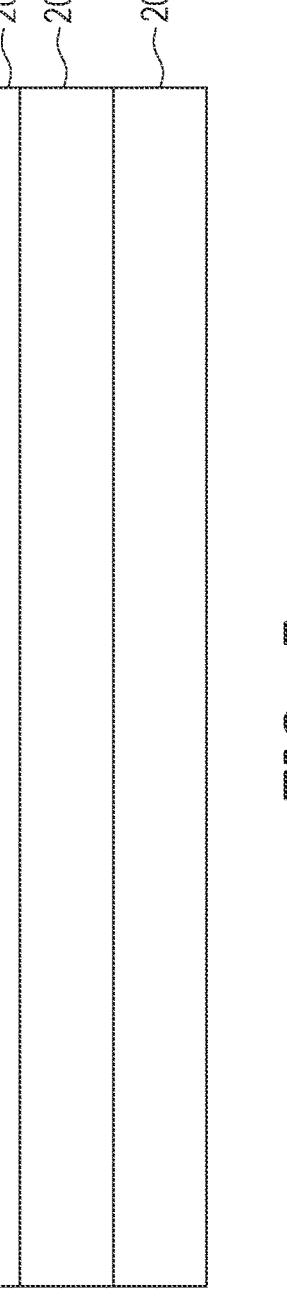

As shown in FIG. 3, at block 104, of the method 100, an optional Ta-containing layer 206 is formed over the gate electrode 204. For example, the optional Ta-containing layer 206 may be in contact with a surface (e.g., a top surface) of the gate electrode 204. In some embodiments, the optional Ta-containing layer 206 may be formed over the gate electrode 204 using a deposition process, such as PVD, plasma-enhanced CVD (PE-CVD), plasma-enhanced ALD (PE-ALD), other suitable processes, and/or combinations thereof. In some embodiments, the optional Ta-containing layer 206 may include tantalum, tantalum nitride, other suitable Ta-containing materials, and/or combinations thereof.

Figure 4:
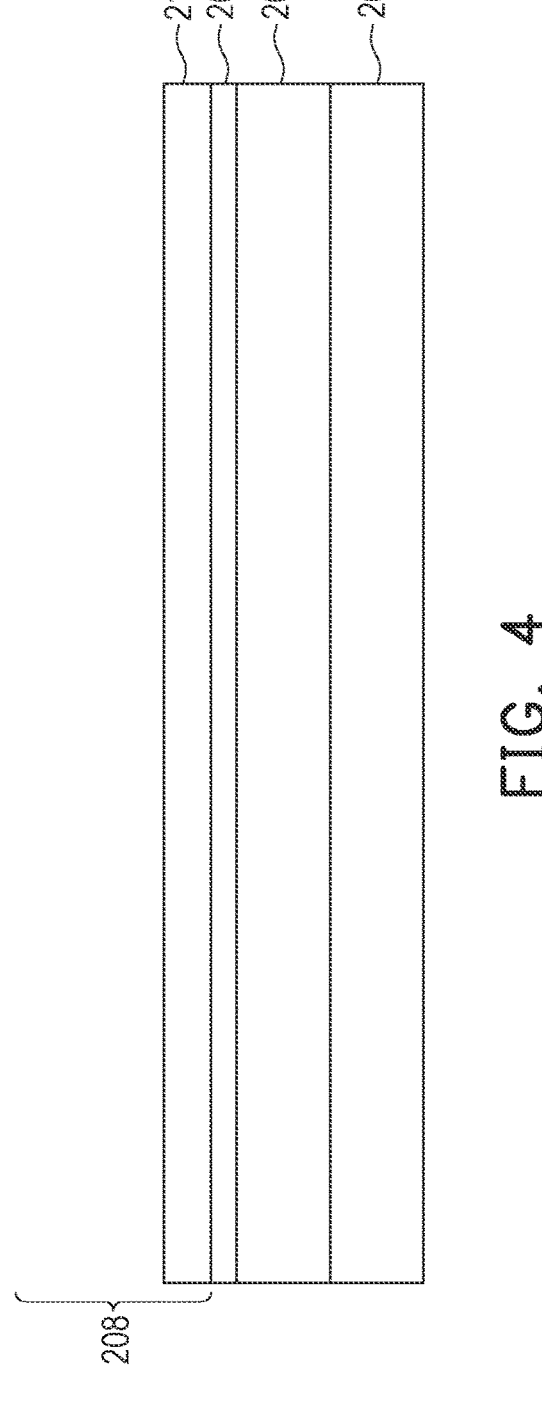
Figure 5:
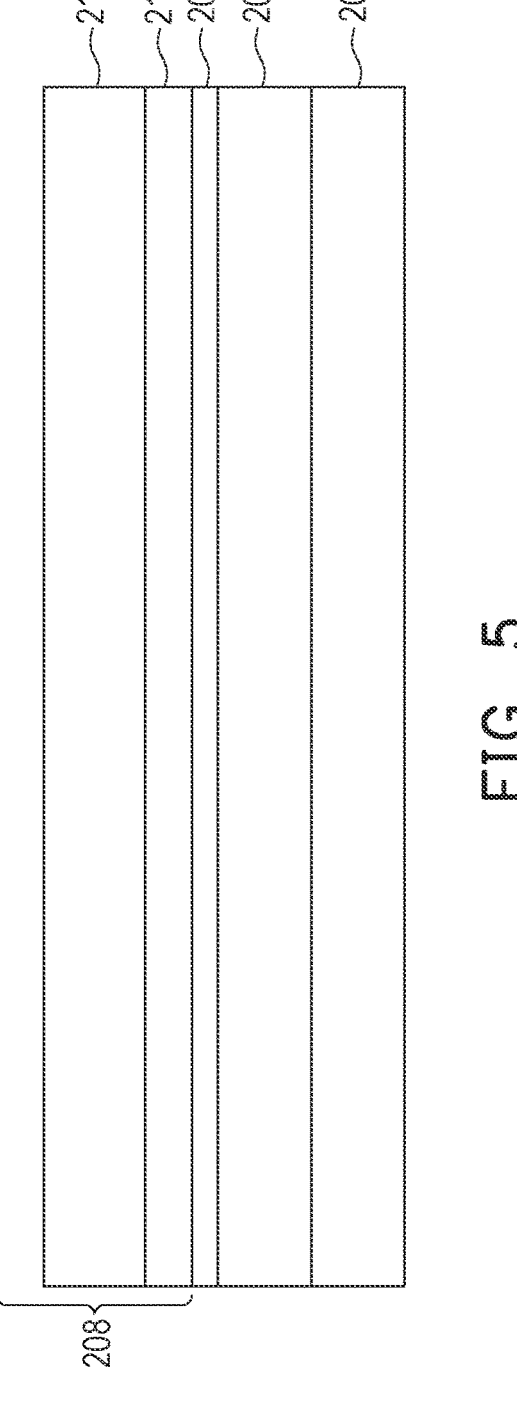
Figure 6:
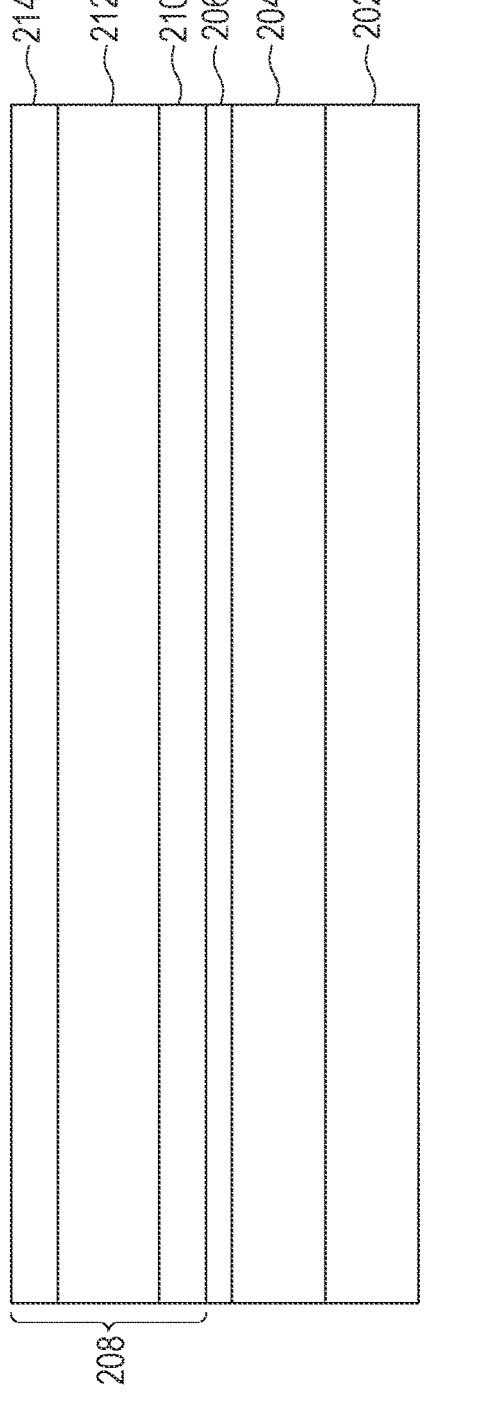

As shown in FIGS. 4-6, at block 106, of the method 100, a ferroelectric layer 208 is formed over the gate electrode 204. For example, the ferroelectric layer 208 may be in contact with a surface (e.g., a top surface) of the gate electrode 204. In some embodiments, when the optional Ta-containing layer 206 is present, for example, the ferroelectric layer 208 may be formed over the optional Ta-containing layer 206 and over the gate electrode 204. For example, the ferroelectric layer 208 may be in contact with a surface (e.g., a top surface) of the optional Ta-containing layer 206.

As shown in FIG. 4, at block 106a, of the method 100, a seed layer 210 is formed over the gate electrode 204. For example, the seed layer 210 may be in contact with a surface (e.g., a top surface) of the gate electrode 204. In some embodiments, when the optional Ta-containing layer 206 is present, for example, the seed layer 210 may be formed over the optional Ta-containing layer 206. For example, the seed layer 210 may be in contact with a surface (e.g., a top surface) of the optional Ta-containing layer 206. The seed layer 210 may have a thickness in a range between about 0.1 nm and about 10 nm.

The seed layer 210 may be configured to promote crystallization and/or the formation of a desired crystal structure in a layer of the ferroelectric layer 208 that is subsequently formed on the seed layer 210 (e.g., memory layer 212, as shown in FIG. 5). For example, the seed layer 210 may promote orthorhombic (O-phase) crystal phases relative to monoclinic (m-phase), cubic (c-phase), and/or tetragonal (t-phase) crystal phases in the memory layer 212. In some embodiments, the seed layer 210 may inhibit the transformation of O-phase crystal structures to m/t/c-phase crystal structures in the memory layer 212. In some embodiments, ferroelectric properties of the memory layer 212 may be improved, based on the presence of the seed layer 210. For example, the memory layer 212 may be characterized by increased remnant polarization ($P_R$).

In some embodiments, the seed layer 210 may be a metal oxide material, such as tantalum oxide ($Ta_2O_5$), zirconium oxide ($ZrO_2$), hafnium oxide ($HfO_2$), $TiO_2$, BaO, SrO, $Y_2O_3$, $HfSiO_2$, zirconium-yttrium oxide ($ZrO_2$—$Y_2O_3$), aluminum oxide ($Al_2O_3$), hafnium zirconium oxide ($Hf_xZr_{1-x}O_2$, where $0 \leq x \leq 1$), other higher-k materials that reduce EIL, other suitable materials, and/or combinations thereof. The seed layer 210 may include a single layer of metal oxide material, or multiple layers of metal oxide materials that may have different compositions. In some embodiments, the material of the seed layer 210 may have a crystal structure including cubic, tetragonal and/or orthorhombic crystal phases.

Figure 21A:
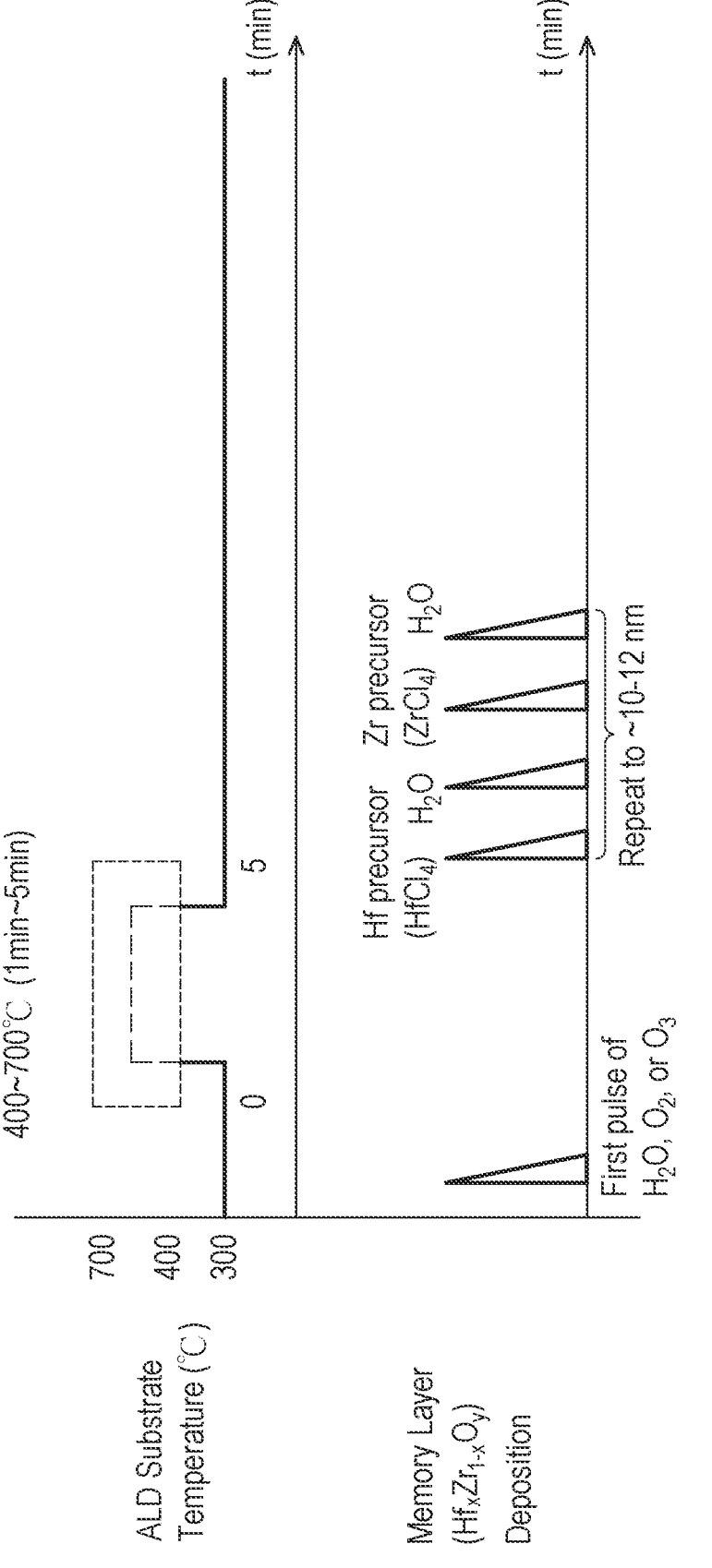
FIG. 21A graphically illustrates an in-situ thermal annealing process according to some embodiments of the present disclosure.
Figure 21B:
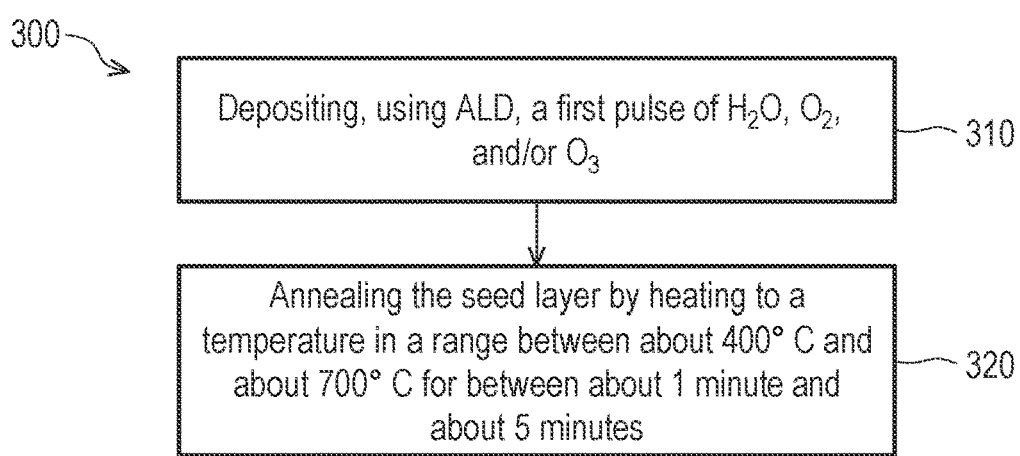
FIG. 21B is a flow chart of a method for forming a seed layer according to some embodiments of the present disclosure.

In some embodiments, the seed layer 210 may be formed using a deposition process, such as ALD, pulsed laser deposition (PLD), other suitable processes, and/or combinations thereof. In some embodiments, the seed layer 210 may be formed using an in-situ thermal annealing process, which is illustrated graphically in FIG. 21A. The in-situ thermal annealing process may increase a crystallinity of the seed layer 210. FIG. 21B depicts a method 300 for forming the seed layer 210 according to embodiments of the present disclosure. At block 310, of the method 300, a first pulse of $H_2O$, $O_2$, or $O_3$ is deposited using ALD. The first pulse is to provide O-atoms to form the seed layer 210. At block 320, of the method 300, the seed layer 210 is annealed by heating to a temperature in a range between about 400° C. and about 700° C. for between about 1 minute and about 5 minutes.

Figure 21C:
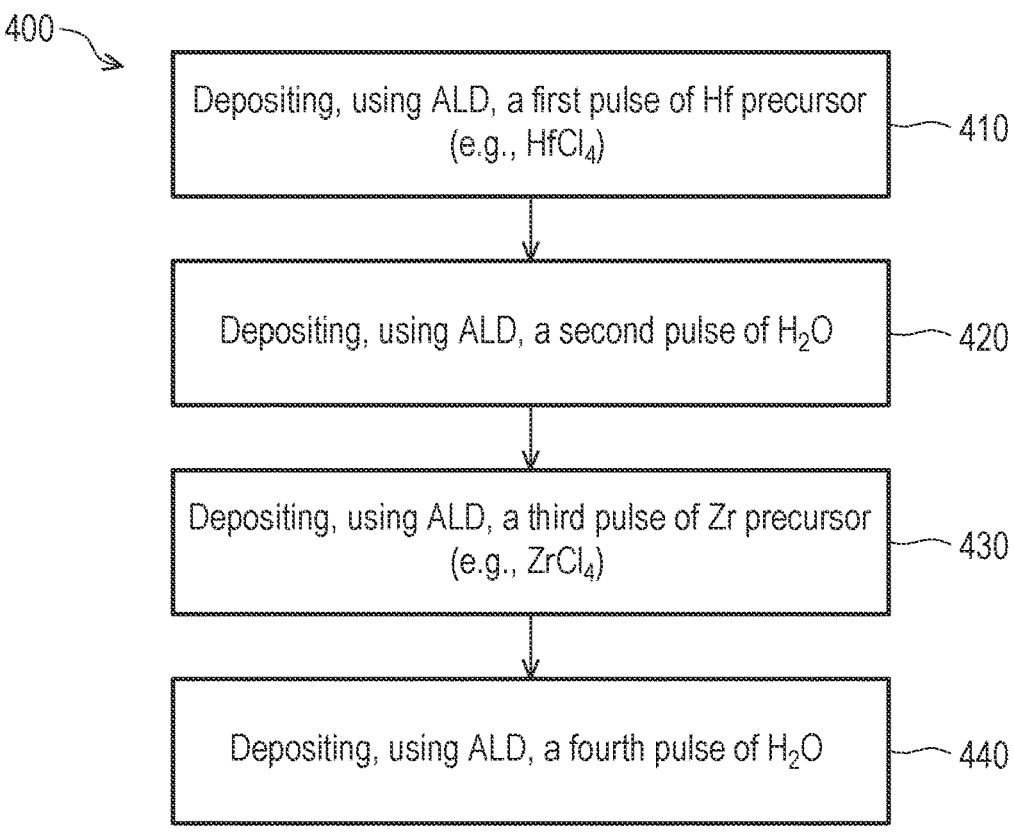
FIG. 21C is a flow chart of a method for forming a memory layer according to some embodiments of the present disclosure.

As shown in FIG. 5, at block 106b, of the method 100, a memory layer 212 is formed over the seed layer 210. For example, the memory layer 212 may be in contact with a surface (e.g., a top surface) of the seed layer 210. The memory layer 212 may have a thickness in a range between about 1 nm and about 100 nm. In some embodiments, the memory layer 212 may include hafnium zirconium oxide ($Hf_xZr_{1-x}O_y$, where $0 \leq x \leq 1$ and $y=2x$), Ta-doped $HfO_2$, Al-doped $HfO_2$, Si-doped $HfO_2$, In-doped $HfO_2$, Zr-doped $HfO_2$, Sc-doped $HfO_2$, Y-doped $HfO_2$, Gd-doped $HfO_2$, La-doped $HfO_2$, Sr-doped $HfO_2$, other suitable materials, and/or combinations thereof. In some embodiments, the memory layer 212 may be formed using a deposition process, such as ALD, PVD (e.g., co-sputtering PVD), other suitable processes, and/or combinations thereof. FIG. 21C depicts a method 400 for forming the memory layer 212 according to embodiments of the present disclosure. At block 410, of the method 400, a first pulse of Hf precursor (e.g., $HfCl_4$) is deposited using ALD. The first pulse is to provide Hf-atoms to form a portion of the memory layer 212. At block 420, of the method 400, a second pulse of $H_2O$ is deposited using ALD. The second pulse is to provide O-atoms to form a portion of the memory layer 212. At block 430, of the method 400, a third pulse of Zr precursor (e.g., $ZrCl_4$) is deposited using ALD. The third pulse is to provide Zr-atoms to form a portion of the memory layer 212. At block 440, of the method 400, a fourth pulse of $H_2O$ is deposited using ALD. The fourth pulse is to provide O-atoms to form a portion of the memory layer 212. In some embodiments, the method 400 may be repeated to form a memory layer having a thickness in a range between about 10 nm and about 12 nm.

As shown in FIG. 6, at block 106c, of the method 100, an interfacial layer 214 is formed over the memory layer 212. For example, the interfacial layer 214 may be in contact with a surface (e.g., a top surface) of the memory layer 212. In some embodiments, the interfacial layer 214 may be a metal oxide material, such as tantalum oxide ($Ta_2O_5$), zirconium oxide ($ZrO_2$), hafnium oxide ($HfO_2$), $TiO_2$, BaO, SrO, $Y_2O_3$, $HfSiO_2$, zirconium-yttrium oxide ($ZrO_2$—$Y_2O_3$), aluminum oxide ($Al_2O_3$), hafnium zirconium oxide ($Hf_xZr_{1-x}O_2$, where $0 \leq x \leq 1$), other higher-k materials that reduce EIL, other suitable materials, and/or combinations thereof. In some embodiments, the interfacial layer 214 may include the same material as the seed layer 210. In other embodiments, the interfacial layer 214 may include one or more materials that are different from the seed layer 210.

In some embodiments, the interfacial layer 214 may be formed using a deposition process, such as ALD, pulsed laser deposition (PLD), other suitable processes, and/or combinations thereof. In some embodiments, the interfacial layer 214 may be formed using an in-situ thermal annealing process, similar to the process described above for the seed layer 210. In some embodiments, the process used to form the interfacial layer 214 may differ, based on the annealing temperature, from the process for the seed layer 210. For example, the annealing temperature for the interfacial layer 214 may be lower than the annealing temperature for the seed layer 210. For example, the annealing temperature for interfacial layer 214 may be less than about 350° C., such as in a range between about 300° C. and 350° C.

In some embodiments, the interfacial layer 214 may promote crystallization (e.g., increase crystallinity and/or form a desired crystal phase) of the memory layer 212 and/or the channel layer 216 with resultant improvement in device performance. For example, crystallization of the memory layer 212 and/or the channel layer 216 may be enhanced based on contact with the interfacial layer 214 (e.g., contact with tantalum oxide ($Ta_2O_5$), zirconium oxide ($ZrO_2$), hafnium oxide ($HfO_2$), $TiO_2$, BaO, SrO, $Y_2O_3$, $HfSiO_2$, zirconium-yttrium oxide ($ZrO_2$—$Y_2O_3$), aluminum oxide ($Al_2O_3$), and/or hafnium zirconium oxide ($Hf_xZr_{1-x}O_2$) of the interfacial layer 214 compared to alternative materials).

Figure 7:

As shown in FIG. 7, at block 108, of the method 100, a channel layer 216 is formed over the ferroelectric layer 208. For example, the channel layer 216 may be formed over the interfacial layer 214 of the ferroelectric layer 208. For example, the channel layer 216 may be in contact with a surface (e.g., a top surface) of the interfacial layer 214. In some embodiments, the channel layer 216 may be formed using a deposition process, such as PVD, CVD, ALD, direct current sputtering, other suitable processes, and/or combinations thereof.

In some embodiments, the channel layer 216 may include amorphous InGaZnO (a-IGZO), InO, ITO, GaZnO, InGaAs, GaN, AlGaAs, Si, Ge, C, SiC, SiGe, SiGeC, $Ga_2O_3$, a II-VI compound semiconductor (e.g., CdS, CdSe, CdTe, ZnS, ZnSe, ZnTe, ZnO, MgO, or GdO, among other examples), a III-V compound semiconductor (e.g., GaAs, InP, GaP, GaN, AlAs, AlGaAs, GaInP, AlInGaP or GaAsIn, among other examples), $M_xM'_yZn_zO$, where 0<(x, y, z)<1, M may be a metal selected from the group consisting of indium (In) and tin (Sn) or combinations thereof, and M' may be a metal selected from the group consisting of gallium (Ga), hafnium (Hf), zirconium (Zr), titanium (Ti), aluminum (Al), strontium (Sr), barium (Ba), scandium (Sc), magnesium (Mg), lanthanum (La), and gadolinium (Gd) or combinations thereof, other suitable materials, and/or combinations thereof. In some embodiments, the channel layer 216 may be a substituted form of amorphous indium gallium zinc oxide (a-IGZO), in which indium may be partially or fully substituted by another metal, such as tin (Sn), that may be configured to provide high carrier mobility within the channel layer 216. Alternatively, or additionally, gallium may be partially or fully substituted by another metal, such as one or more of hafnium (Hf), zirconium (Zr), titanium (Ti), aluminum (Al), strontium (Sr), barium (Ba), scandium (Sc), magnesium (Mg), lanthanum (La), or gadolinium (Gd), that may be configured to reduce oxygen vacancies and lower surface states ($D_{it}$).

Figure 8:
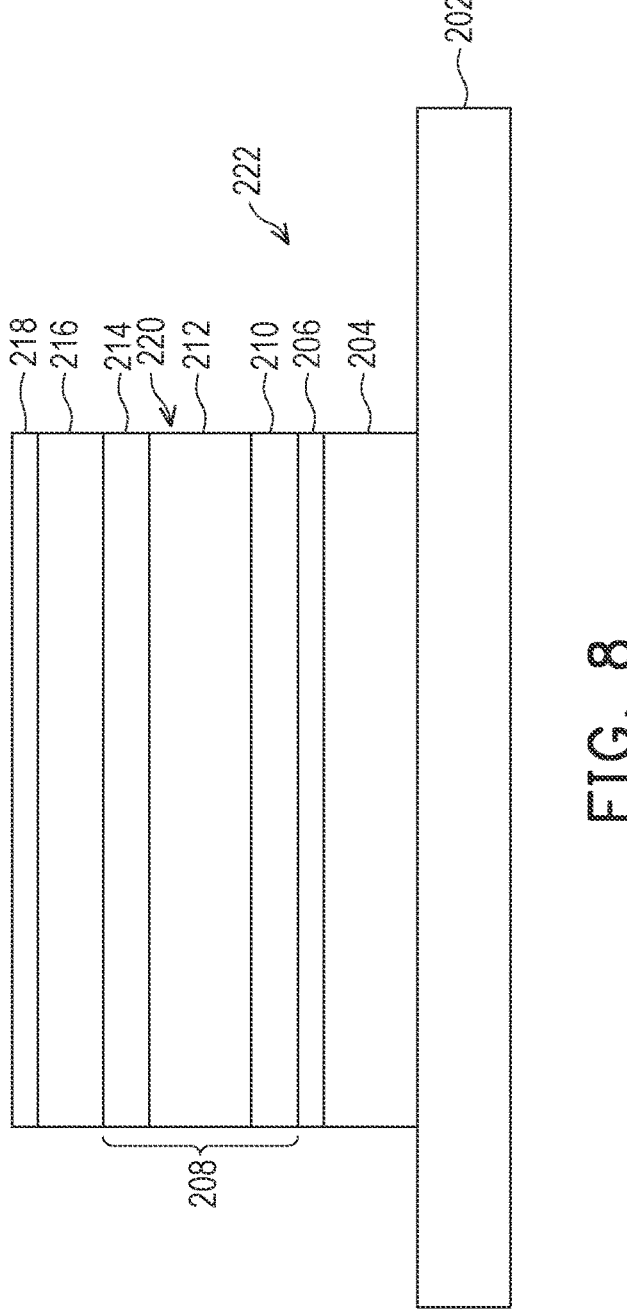

As shown in FIG. 8, at block 110, of the method 100, a capping layer 218 is formed over the channel layer 216. For example, the capping layer 218 may be in contact with a surface (e.g., a top surface) of the channel layer 216. In some embodiments, the capping layer 218 may be formed using a deposition process, such as PVD, PE-CVD, PE-ALD, other suitable processes, and/or combinations thereof. In some embodiments, the capping layer 218 may include a metal oxide with bond dissociation energy greater than Zn—O, such as $CeO_x$, $BeO_x$, $InO_x$, $GaO_x$, $AlO_x$, $SnO_x$, $VO_x$, $WO_x$, $TiO_x$, $ZrO_x$, $NbO_x$, $HfO_x$, $SiO_x$, or $TaO_x$, a binary metal oxide based on any combination of the preceding metal oxides (e.g., $InGaO_x$ or $InAlO_x$, among other examples), a ternary metal oxide based on any combination of the preceding metal oxides, other suitable materials, and/or combinations thereof. In some embodiments, the capping layer 218 may be annealed by heating to a temperature less than 350° C., such as in a range between about 300° C. and 350° C. In some embodiments, the heating may occur for a length of time greater than about 1 hour, such as in a range between about 1 hour and about 1.5 hours. In some embodiments, the capping layer 218 may be formed using an in-situ thermal annealing process, similar to the process described above for the seed layer 210 and the interfacial layer 214. In some embodiments, the in-situ thermal annealing process may include a first pulse of $O_2$ deposited using ALD, followed by heating, and a second pulse of metal precursor deposited using ALD.

After the capping layer 218 is formed over the channel layer 216, one or more layers of the semiconductor device 200 may be patterned to form a multilayer structure 220. For example, the multilayer structure 220 may include the gate electrode 204, the optional Ta-containing layer 206, the ferroelectric layer 208 (e.g., the seed layer 210, the memory layer 212, and the interfacial layer 214), the channel layer 216, and the capping layer 218. The multilayer structure 220 may include a right sidewall, a left sidewall that is opposite the right sidewall, a bottom (e.g., corresponding to the gate electrode 204), and a top (e.g., corresponding to the capping layer 218) that is opposite the bottom and/or opposite the substrate 202. A recess 222 (e.g., a trench) may surround the multilayer structure 220 (e.g., beside the right sidewall and the left sidewall of the multilayer structure 220). For example, the recess 222 may be defined over a surface of the substrate 202 (e.g., over the top surface, of the substrate 202, which may be in contact with the gate electrode 204).

As described above, in some embodiments, the gate electrode 204 is buried in the substrate 202. An opening may be formed in the substrate 202, and the gate electrode 204 is formed in the opening. The optional Ta-containing layer 206, the ferroelectric layer 208, the channel layer 216, and the capping layer 218 are then formed and patterned to form the multilayer structure 220.

As used herein, the terms "pattern," "patterned," and "patterning" may refer to a multi-step process that includes, for example, forming a mask over an upper surface of a respective layer, patterning the mask using photolithography to remove portions of the mask and expose portions of the upper surface of the respective layer, etching through the patterned mask to remove portions of the respective layer, and/or removing the patterned mask using a suitable process (e.g., ashing or dissolution with a solvent, among other examples).

Figure 9:
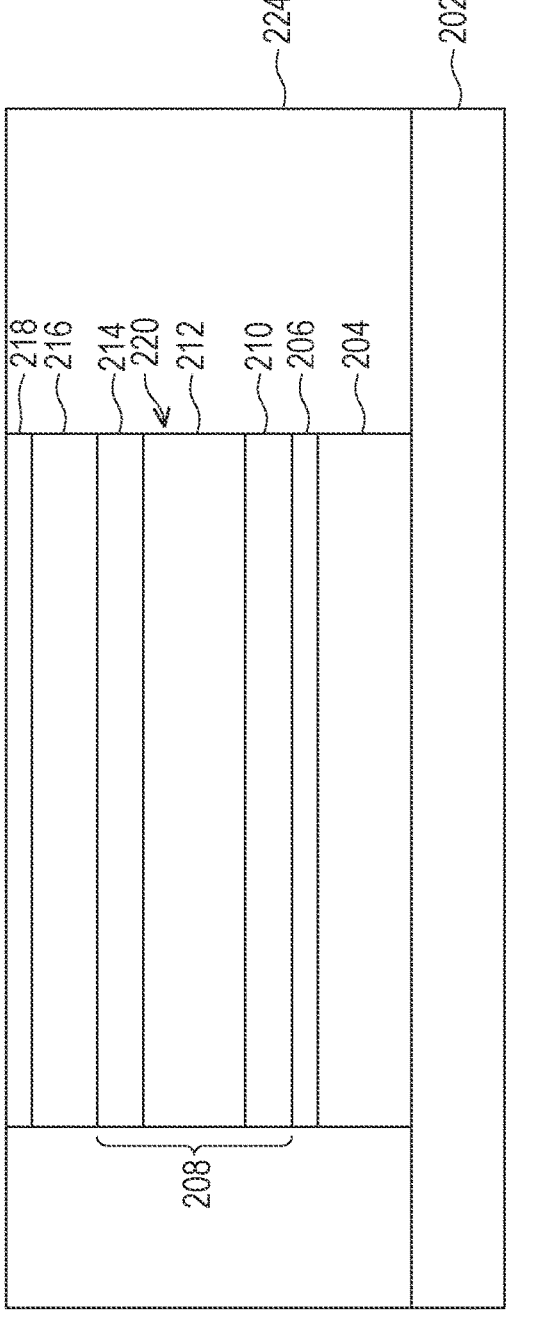

As shown in FIG. 9, at block 112, of the method 100, a first interlayer dielectric (ILD) layer 224 is formed. For example, the first ILD layer 224 may be formed in the recess 222 and/or may surround the multilayer structure 220. For example, the first ILD layer 224 may be in contact with the substrate 202 (e.g., the top surface of the substrate 202), the right sidewall, and/or the left sidewall of the multilayer structure 220.

In some embodiments, a portion of the first ILD layer 224 may be formed over the capping layer 218. For example, the portion of the first ILD layer 224 may be in contact with a top surface of the capping layer 218. However, the portion of the first ILD layer 224, formed over the capping layer 218, may be removed (e.g., during one or more subsequent steps) so that the capping layer 218 may define a top surface of the semiconductor device 200, as shown in FIG. 9. For example, the portion of the first ILD layer 224, formed over the capping layer 218, may be removed using one or more processes, common to the field of semiconductor manufacturing, for the removal of materials and/or material layers (e.g., chemical mechanical polishing (CMP) and/or etching, among other examples).

At block 114, of the method 100, the semiconductor device 200 is annealed, after forming the capping layer 218, at a temperature less than 350° C. In some embodiments, the semiconductor device 200 may be annealed after the first ILD layer 224 is formed and/or after the portion of the first ILD layer 224, formed over the capping layer 218, is removed, as described above. In some embodiments, the annealing process at block 114 may be, or may be in addition to, the annealing process described above for the formation of the capping layer 218 at block 110. In other words, the annealing of the capping layer 218 may occur either before or after patterning to form the multilayer structure 220 and/or forming the first ILD layer 224.

In some embodiments, one or more characteristics associated with the semiconductor device 200, and/or fabrication of the semiconductor device 200, described herein may improve resistance to hydrogen diffusion (which also may be referred to herein as "hydrogen resist") into the multilayer structure 220 (e.g., into the channel layer 216) from surrounding layers with resultant improvement in device performance. In some embodiments, sources of hydrogen, in the semiconductor device 200 (e.g., in one or more layers surrounding the multilayer structure 220), to be resisted may include the first ILD layer 224, a second ILD layer 228, and/or a third ILD layer 246 (e.g., from hydrogen containing precursors in the respective layers). For example, the semiconductor device 200 (e.g., the multilayer structure 220) may be annealed (e.g., at block 114) at a temperature (e.g., less than 350° C.) that is lower than other temperatures that may be known in the art for the annealing of analogous structures, based on the presence of the capping layer 218 (e.g., based on properties and/or characteristics of the capping layer 218 based on one or more deposition processes and/or material compositions, described above, in relation to block 110). For example, a temperature needed for re-crystallization of the channel layer 216, to form a crystalline structure (e.g., to increase crystallinity and/or form a desired crystal phase), may be reduced from normal levels, based on the presence of the capping layer 218. In some embodiments, annealing at the lower temperature (e.g., less than 350° C.) may reduce and/or prevent diffusion of $H_2$ into the multilayer structure 220 (e.g., into the channel layer 216) from surrounding layers (e.g., from the first ILD layer 224, the second ILD layer 228, and/or the third ILD layer 246).

Figure 10:
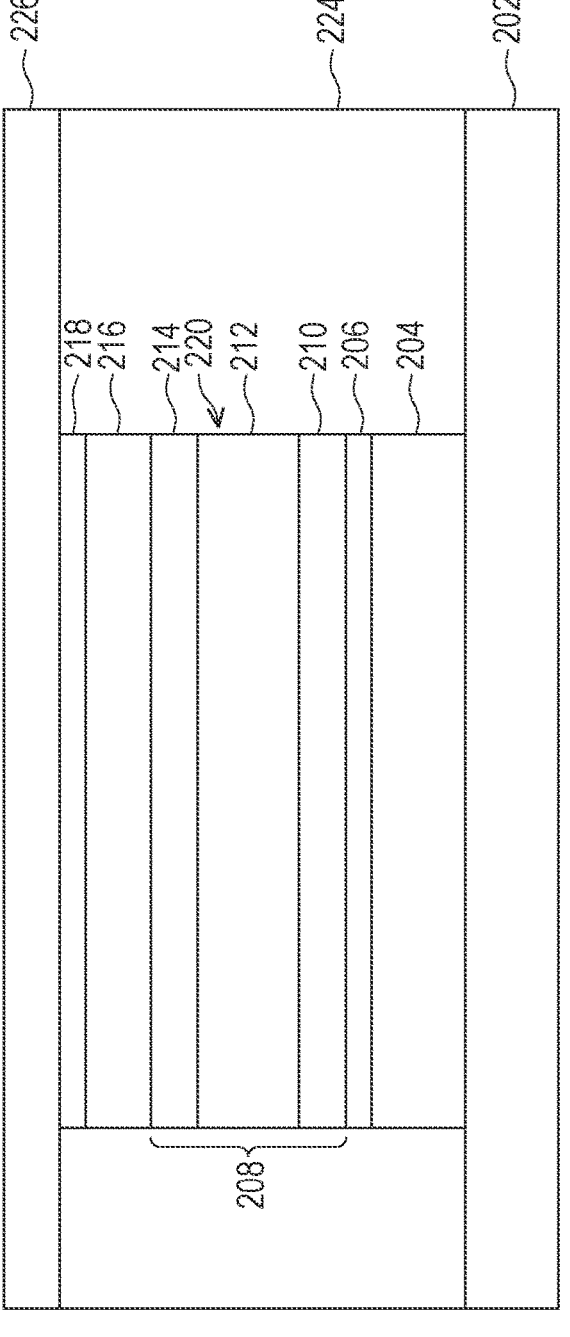

As shown in FIG. 10, at block 116, of the method 100, a dielectric layer 226 (which also may be referred to herein as a "first dielectric layer") is formed over the capping layer 218. For example, the dielectric layer 226 may be in contact with the top surface of the capping layer 218. In some embodiments, the dielectric layer 226 may be formed over the first ILD layer 224. For example, the dielectric layer 226 may be in contact with a surface (e.g., a top surface) of the first ILD layer 224. In some embodiments, the dielectric layer 226 may be formed using a deposition process, such as PVD, CVD, ALD, sputtering (e.g., direct current sputtering), other suitable processes, and/or combinations thereof. In some embodiments, the dielectric layer 226 may include $AlO_x$ (e.g., $Al_2O_3$), $SiN_x$ (e.g., $Si_3N_4$), TiC, $TiO_2$, other suitable materials, and/or combinations thereof.

In some embodiments, the dielectric layer 226 may be a hydrogen resist layer that is configured to improve device performance. For example, the dielectric layer 226 may reduce and/or prevent diffusion of $H_2$ into one or more layers underneath the dielectric layer 226 (e.g., one or more layers of the multilayer structure 220, such as the channel layer 216) from surrounding layers (e.g., one or more layers above the dielectric layer 226, as described in more detail below). For example, material compositions of the dielectric layer 226 that include $AlO_x$ (e.g., $Al_2O_3$), $SiN_x$ (e.g., $Si_3N_4$), TiC, and/or $TiO_2$ may improve resistance to hydrogen diffusion compared to alternative compositions.

Figure 11:
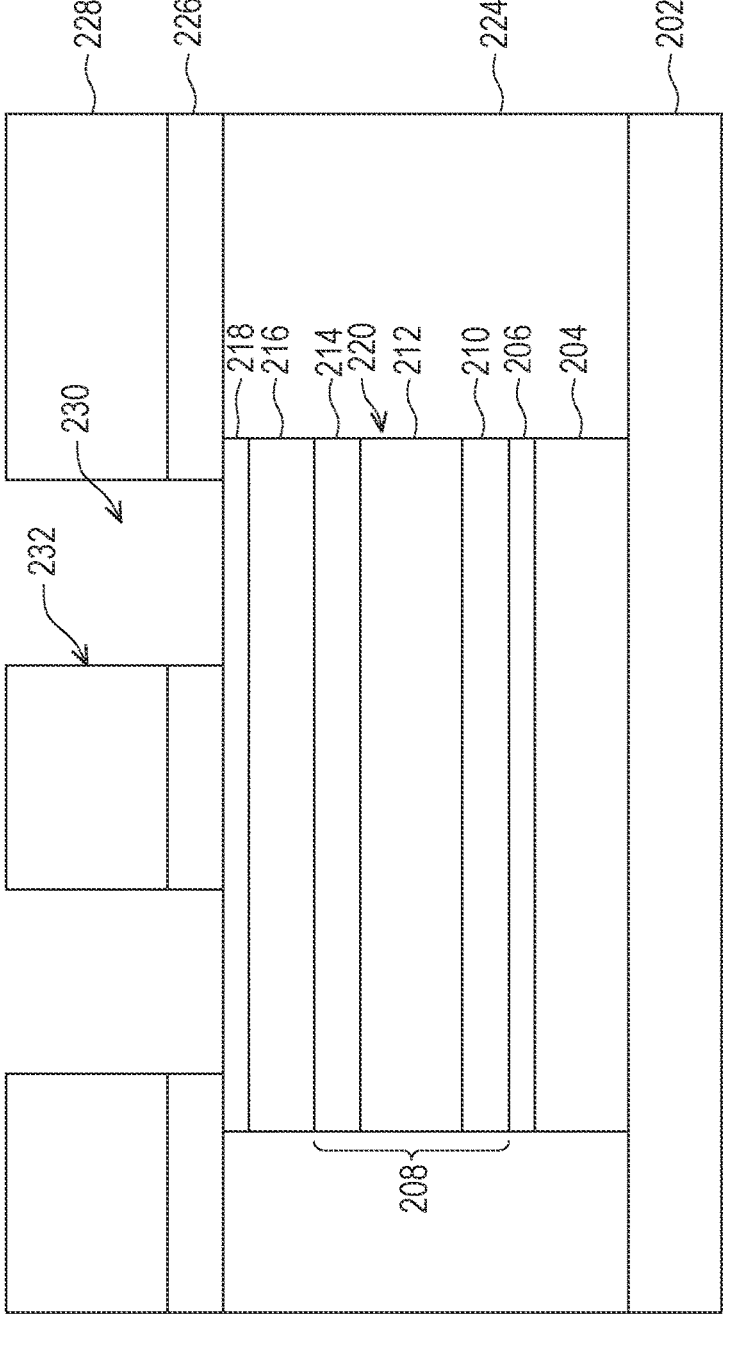

As shown in FIG. 11, at block 118, of the method 100, a second ILD layer 228 is formed. For example, the second ILD layer 228 may be formed over the dielectric layer 226 and/or over the capping layer 218. For example, the second ILD layer 228 may be in contact with a surface (e.g., a top surface) of the dielectric layer 226.

After the second ILD layer 228 is formed, one or more layers of the semiconductor device 200 may be patterned to form a source/drain (S/D) contact region 230 (which also may be referred to herein as a "first S/D contact region"). For example, the S/D contact region 230 may include a first recess (e.g., a first trench) and a second recess (e.g., a second trench), as shown in FIG. 11. The S/D contact region 230 may include surfaces 232 (e.g., a first (right) sidewall, a second (left) sidewall that is opposite the first sidewall (e.g., facing away from the first sidewall), and/or a bottom wall). For example, a volume of the S/D contact region 230 may be defined between the first and second sidewalls and over the bottom wall. The S/D contact region 230 may extend to and/or within the multilayer structure 220. A depth of the S/D contact region 230, a layer, of the multilayer structure 220, that defines the bottom wall of the S/D contact region 230, and/or layers, of the semiconductor device 200 that define the first sidewall and the second sidewall of the S/D contact region 230 may differ, according to different embodiments of the present disclosure, as described in more detail below with reference to FIGS. 1B-1D.

Figure 1B:
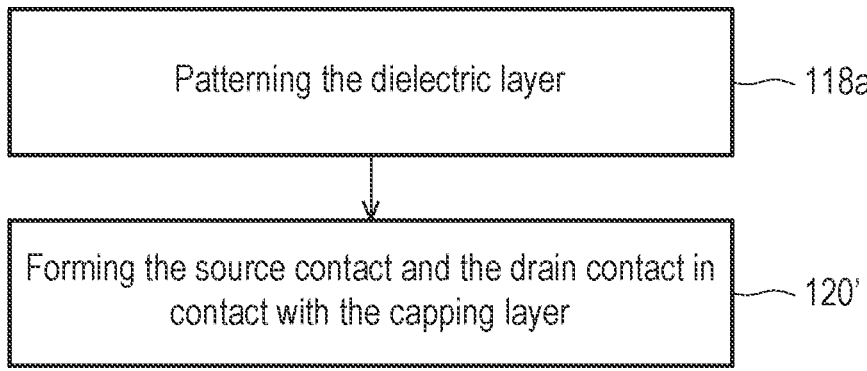
FIG. 1B is a flow chart of a portion of a method for manufacturing a semiconductor device according to some embodiments of the present disclosure.

According to FIG. 1B, at block 118a, of the method 100, the dielectric layer 226 is patterned so that the bottom wall of the S/D contact region 230 is defined by the capping layer 218, as shown in FIG. 11. For example, the S/D contact region 230 may extend to the multilayer structure 220 (e.g., to the top of the multilayer structure 220, as described above), without extending into the multilayer structure 220 and/or through the capping layer 218. For example, the depth of the S/D contact region 230 may correspond to a combined depth of the second ILD layer 228 and the dielectric layer 226. The first sidewall and the second sidewall of the S/D contact region 230 may be defined by the second ILD layer 228 and the dielectric layer 226.

Figure 1C:
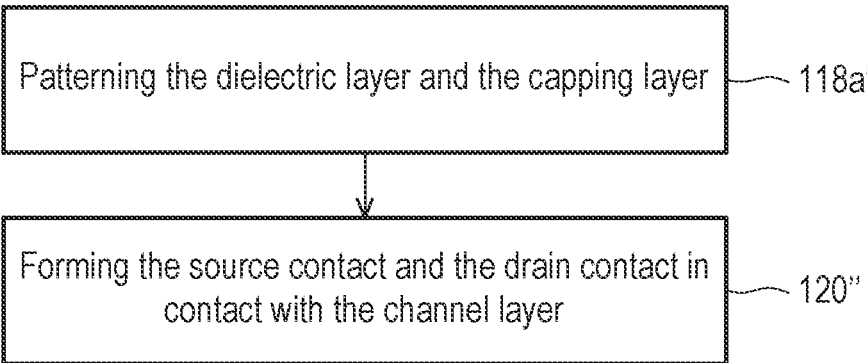
FIG. 1C is a flow chart of the portion of the method for manufacturing a semiconductor device according to another embodiment of the present disclosure.
Figure 19:
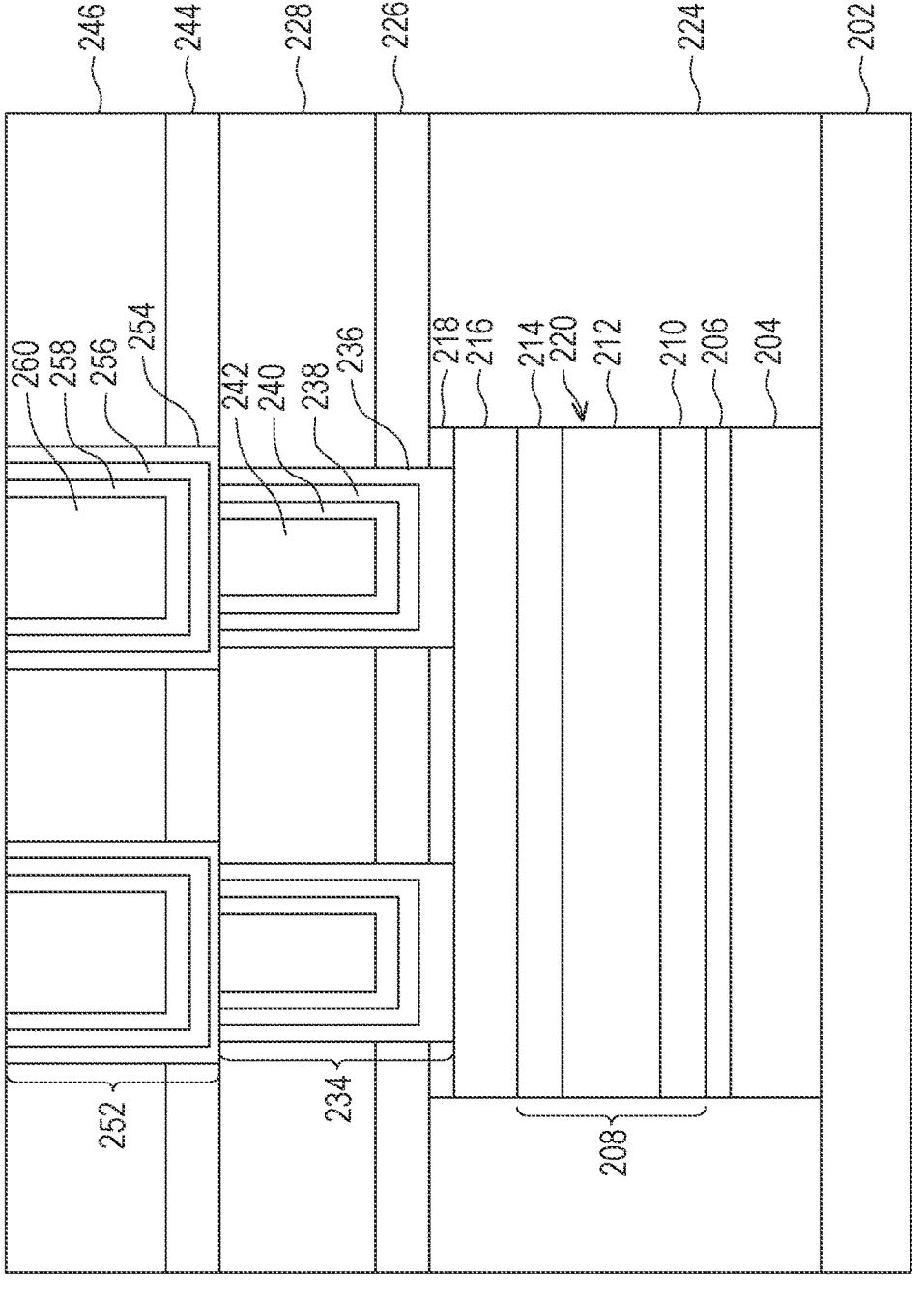
FIG. 19 schematically illustrates a semiconductor device according to another embodiment of the present disclosure.

According to FIG. 1C, at block 118a', of the method 100, the dielectric layer 226 and the capping layer 218 are patterned so that the bottom wall of the S/D contact region 230 is defined by the channel layer 216, as shown in FIG. 19. For example, the S/D contact region 230 may extend into the multilayer structure 220 (e.g., through the capping layer 218), without extending into and/or through the channel layer 216. For example, the depth of the S/D contact region 230 may correspond to a combined depth of the second ILD layer 228, the dielectric layer 226, and the capping layer 218. For example, the first sidewall and the second sidewall of the S/D contact region 230 may be defined by the second ILD layer 228, the dielectric layer 226, and the capping layer 218.

Figure 1D:
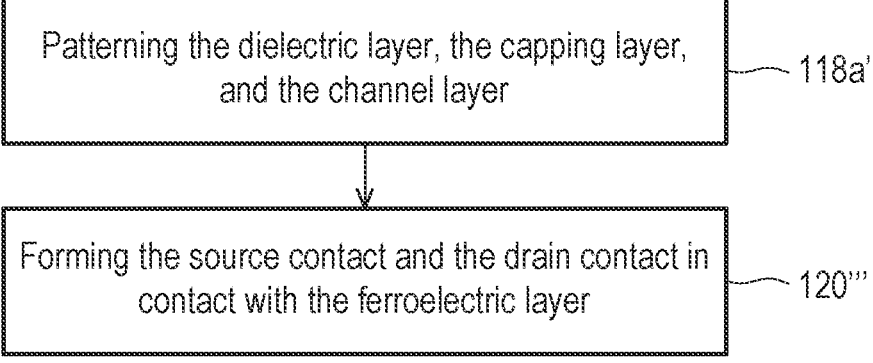
FIG. 1D is a flow chart of the portion of the method for manufacturing a semiconductor device according to another embodiment of the present disclosure.
Figure 20:
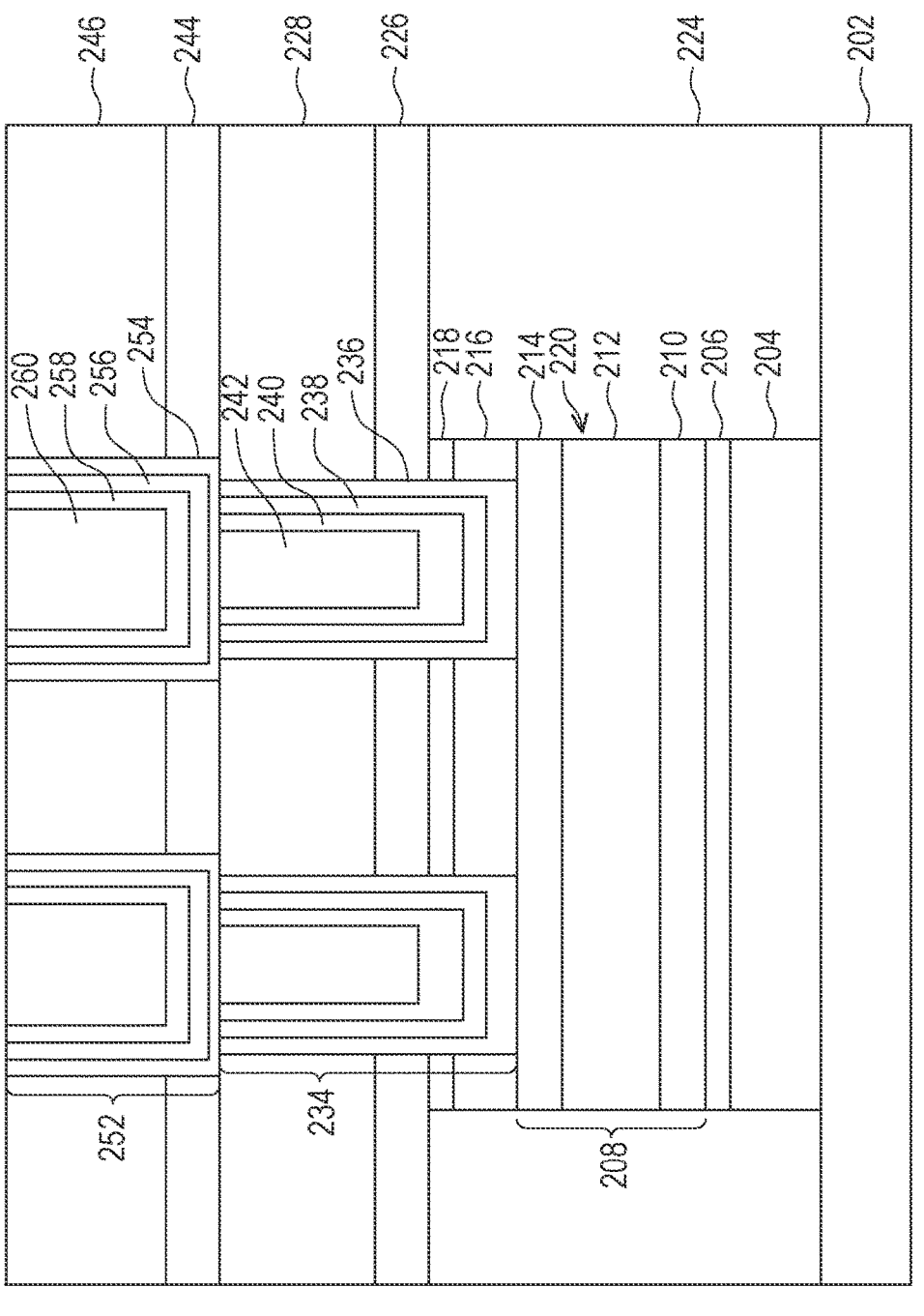
FIG. 20 schematically illustrates a semiconductor device according to another embodiment of the present disclosure.

According to FIG. 1D, at block 118a", of the method 100, the dielectric layer 226, the capping layer 218, and the channel layer 216 are patterned so that the bottom wall of the S/D contact region 230 is defined by the ferroelectric layer 208 (e.g., defined by the interfacial layer 214, of the ferroelectric layer 208, as shown in FIG. 20). For example, the S/D contact region 230 may extend into the multilayer structure 220 (e.g., through the capping layer 218 and the channel layer 216), without extending into and/or through the interfacial layer 214. For example, the depth of the S/D contact region 230 may correspond to a combined depth of the second ILD layer 228, the dielectric layer 226, the capping layer 218, and the channel layer 216. For example, the first sidewall and the second sidewall of the S/D contact region 230 may be defined by the second ILD layer 228, the dielectric layer 226, the capping layer 218, and the channel layer 216.

Figure 13:
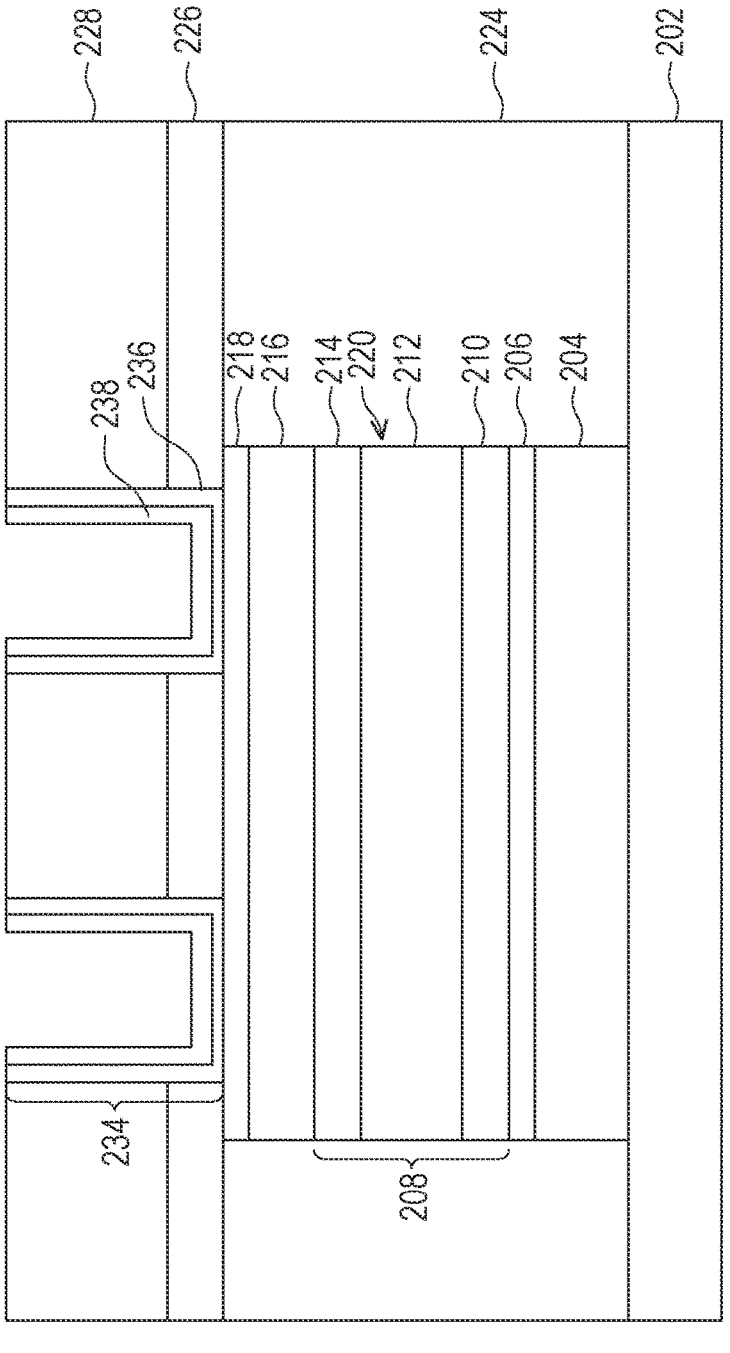
Figure 14:
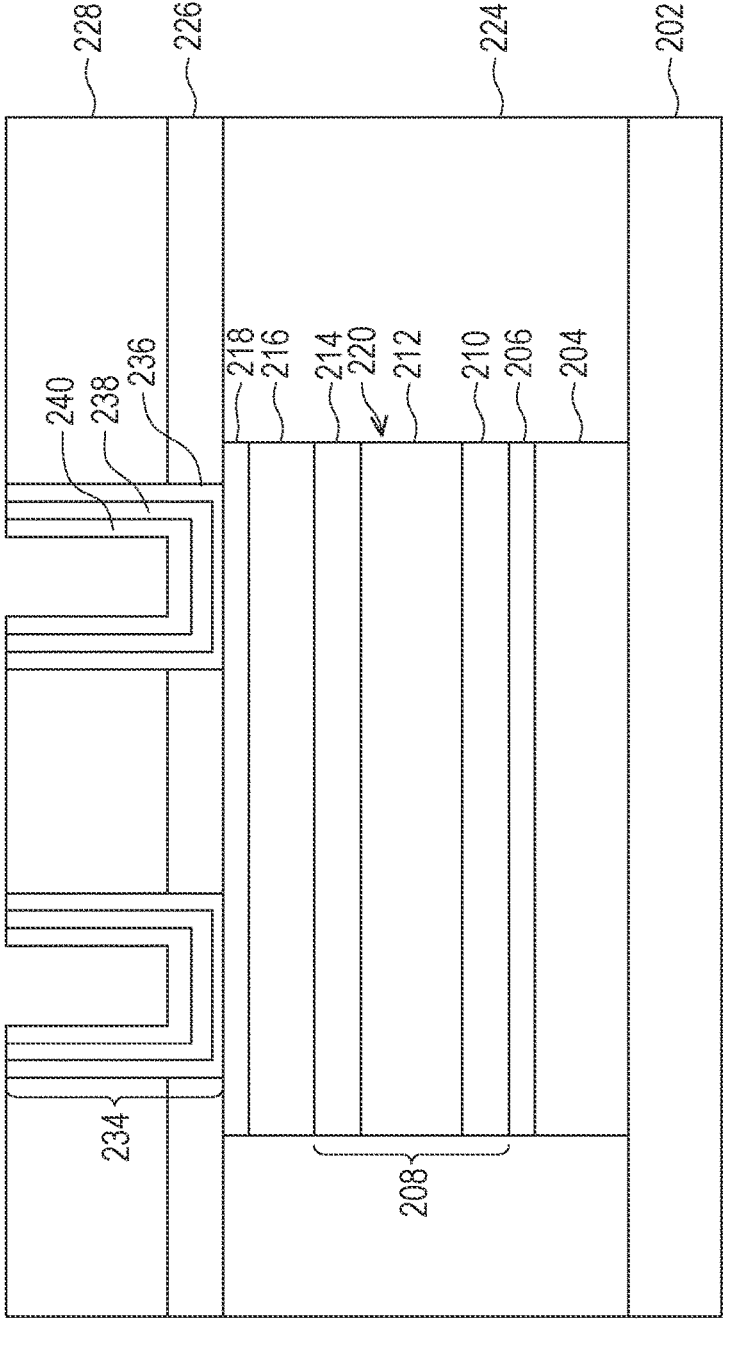
Figure 15:
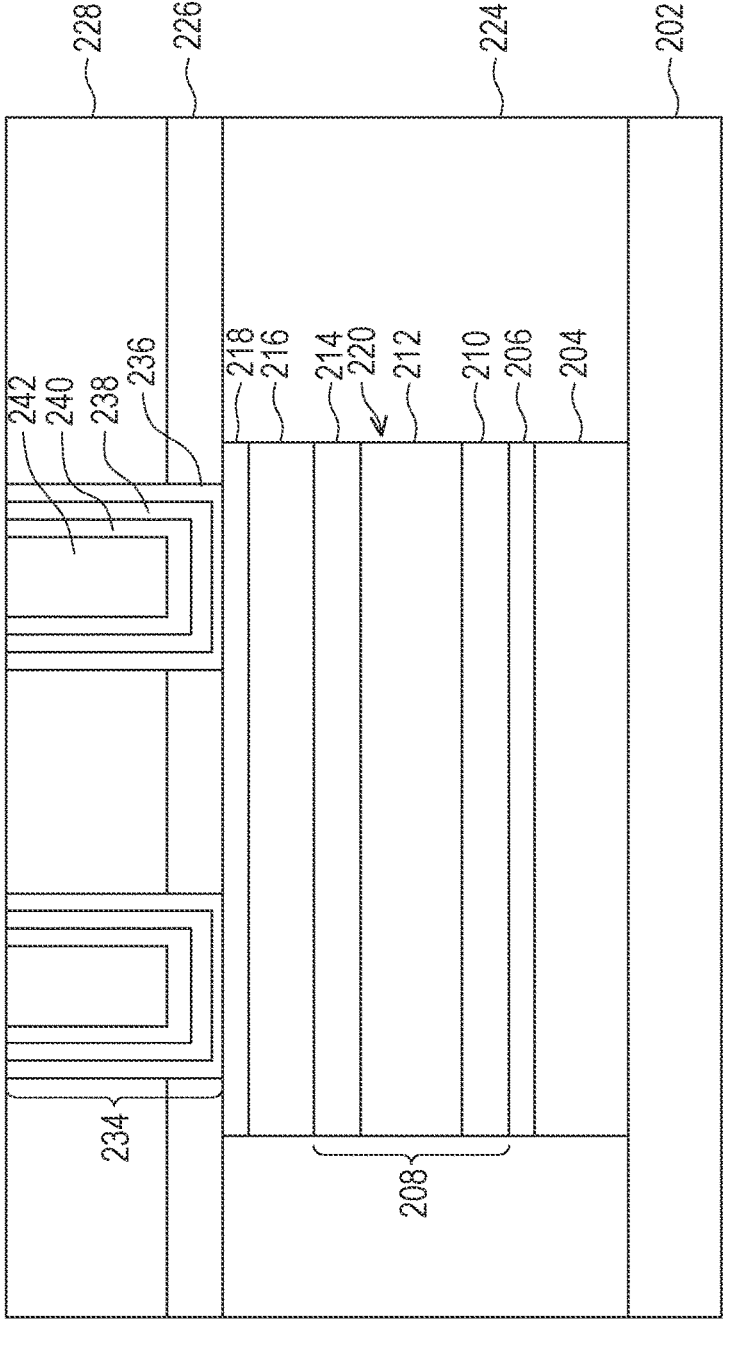

As shown in FIGS. 12-15, at block 120, of the method 100, a source contact and a drain contact (collectively, S/D contact structure 234) are formed in the dielectric layer 226. The S/D contact structure 234 (which also may be referred to herein as a "first S/D contact structure") may be defined by the surfaces 232 of the S/D contact region 230. In some embodiments, the source contact and the drain contact may be formed in contact with the capping layer 218 (e.g., according to FIG. 1B, at block 120', as shown in FIG. 15), the channel layer 216 (e.g., according to FIG. 1C, at block 120", as shown in FIG. 19), and/or the ferroelectric layer 208 (e.g., according to FIG. 1D, at block 120", as shown in FIG. 20). In some embodiments, a closeness and/or contact between the S/D contact structure 234 and the ferroelectric layer 208 may cause an increase to a polarization value of the ferroelectric layer 208 with resultant improvement in device performance. For example, in FIG. 19, over etching of the S/D contact region 230 to touch the channel layer 216, and formation of the S/D contact structure 234 in contact with the channel layer 216, may cause an increase to the polarization value of the ferroelectric layer 208 compared, for example, to the formation of the S/D contact structure 234 in contact with the capping layer 218 (as shown in FIG. 15). Likewise, in FIG. 20, over etching of the S/D contact region 230 to touch the ferroelectric layer 208, and formation of the S/D contact structure 234 in contact with the ferroelectric layer 208, may cause an increase to the polarization value of the ferroelectric layer 208 compared, for example, to both the formation of the S/D contact structure 234 in contact with the capping layer 218 (as shown in FIG. 15) and the formation of the S/D contact structure 234 in contact with the channel layer 216 (as shown in FIG. 19). In other words, the polarization value of the ferroelectric layer 208 may be negatively correlated to distance between the S/D contact structure 234 and the ferroelectric layer 208 (e.g., polarization value for S/D in contact with ferroelectric layer>S/D in contact with channel layer>S/D in contact with capping layer).

In some embodiments, the S/D contact structure 234 may be a hydrogen resist layer that is configured to improve device performance. For example, the S/D contact structure 234 may reduce and/or prevent diffusion of $H_2$ into one or more layers underneath the dielectric layer 226 (e.g., one or more layers of the multilayer structure 220, such as the channel layer 216) from surrounding layers (e.g., one or more layers above or beside the S/D contact structure 234, such as a subsequent ILD layer that is formed using a $H_2$ containing precursor, as described in more detail below). For example, material compositions of the S/D contact structure 234 that include combinations of materials described below may improve resistance to hydrogen diffusion compared to alternative compositions.

Figure 12:
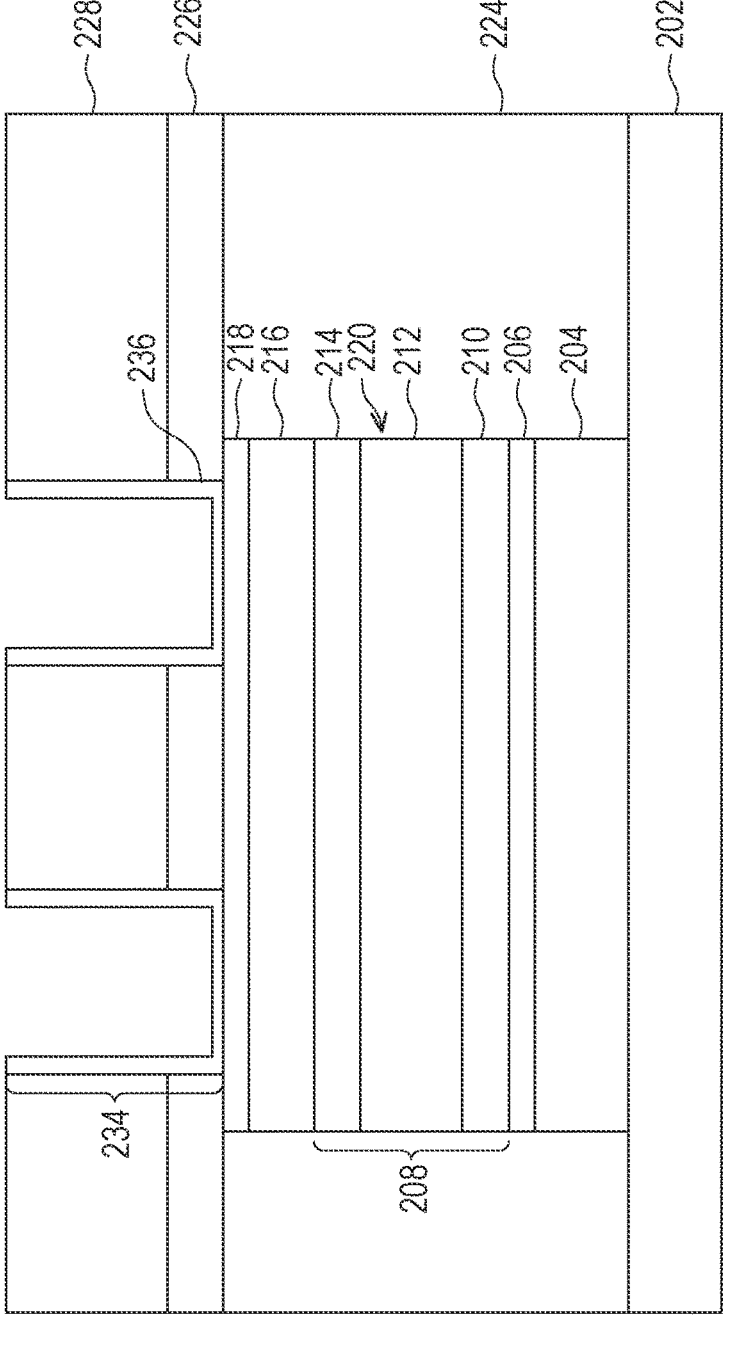

As shown in FIG. 12, at block 120a, of the method 100, a first conductive layer 236 is formed. The first conductive layer 236 may be formed over the capping layer 218, the channel layer 216, and/or the ferroelectric layer 208, as described above with reference to the source contact and the drain contact, of the S/D contact structure 234. In some embodiments, the first conductive layer 236 may be formed using a deposition process, such as PVD, CVD, PE-CVD, ALD, PE-ALD, direct current sputtering, other suitable processes, and/or combinations thereof. In some embodiments, the first conductive layer 236 may include TiN, TaN, WN, other suitable materials, and/or combinations thereof.

As shown in FIG. 13, at block 120b, of the method 100, a second conductive layer 238 is formed over the first conductive layer 236. For example, the second conductive layer 238 may be in contact with one or more surfaces (e.g., a first (right) sidewall, a second (left) sidewall that is opposite the first sidewall (e.g., facing towards the first sidewall), and/or a top wall) of the first conductive layer 236. In some embodiments, the second conductive layer 238 may be formed using a deposition process, such as PVD, CVD, PE-CVD, ALD, PE-ALD, direct current sputtering, other suitable processes, and/or combinations thereof. In some embodiments, the second conductive layer 238 may include Ti, Zr, Th, V, Pd, Cu, W, other suitable materials, and/or combinations thereof.

As shown in FIG. 14, at block 120c, of the method 100, a third conductive layer 240 is formed over the second conductive layer 238. For example, the third conductive layer 240 may be in contact with one or more surfaces (e.g., a first (right) sidewall, a second (left) sidewall that is opposite the first sidewall (e.g., facing towards the first sidewall), and/or a top wall) of the second conductive layer 238. In some embodiments, the third conductive layer 240 may be formed using a deposition process, such as PVD, CVD, PE-CVD, ALD, PE-ALD, direct current sputtering, other suitable processes, and/or combinations thereof. In some embodiments, the third conductive layer 240 may include TiN, TaN, WN, other suitable materials, and/or combinations thereof.

As shown in FIG. 15, at block 120d, of the method 100, a conductive fill layer 242 is formed over the third conductive layer 240. For example, the conductive fill layer 242 may be in contact with one or more surfaces (e.g., a first (right) sidewall, a second (left) sidewall that is opposite the first sidewall (e.g., facing towards the first sidewall), and/or a top wall) of the third conductive layer 240. In some embodiments, the conductive fill layer 242 may be formed using a deposition process, such as PVD, CVD, PE-CVD, ALD, PE-ALD, direct current sputtering, other suitable processes, and/or combinations thereof. In some embodiments, the conductive fill layer 242 may include Ru, Al, Pt, Ag, Co, Fe, Sn, Ni, other suitable materials, and/or combinations thereof. In some embodiments, the conductive fill layer 242 may not include Cu. For example, material compositions of the conductive fill layer that include Ru, Al, Pt, Ag, Co, Fe, Sn, and/or Ni without Cu may eliminate the need for, and thus may not include, a barrier layer (e.g., one or more of the first, second, or third conductive layers 236, 238, 240) to reduce and/or prevent diffusion of Cu compared to alternative compositions that include Cu. However, embodiments of the present disclosure include the barrier layer for enhanced resistance to hydrogen diffusion.

As described above, the S/D contact structure 234 may be a hydrogen resist layer that is configured to improve device performance. In some embodiments, the presence of multiple independent hydrogen resist layers (e.g., the first conductive layer 236, the second conductive layer 238, the third conductive layer 240, and the conductive fill layer 242), collectively, may improve resistance to hydrogen diffusion compared to multilayer, or multi-metal, structures with fewer independent hydrogen resist layers and/or alternative compositions for the independent hydrogen resist layers.

Figure 16:
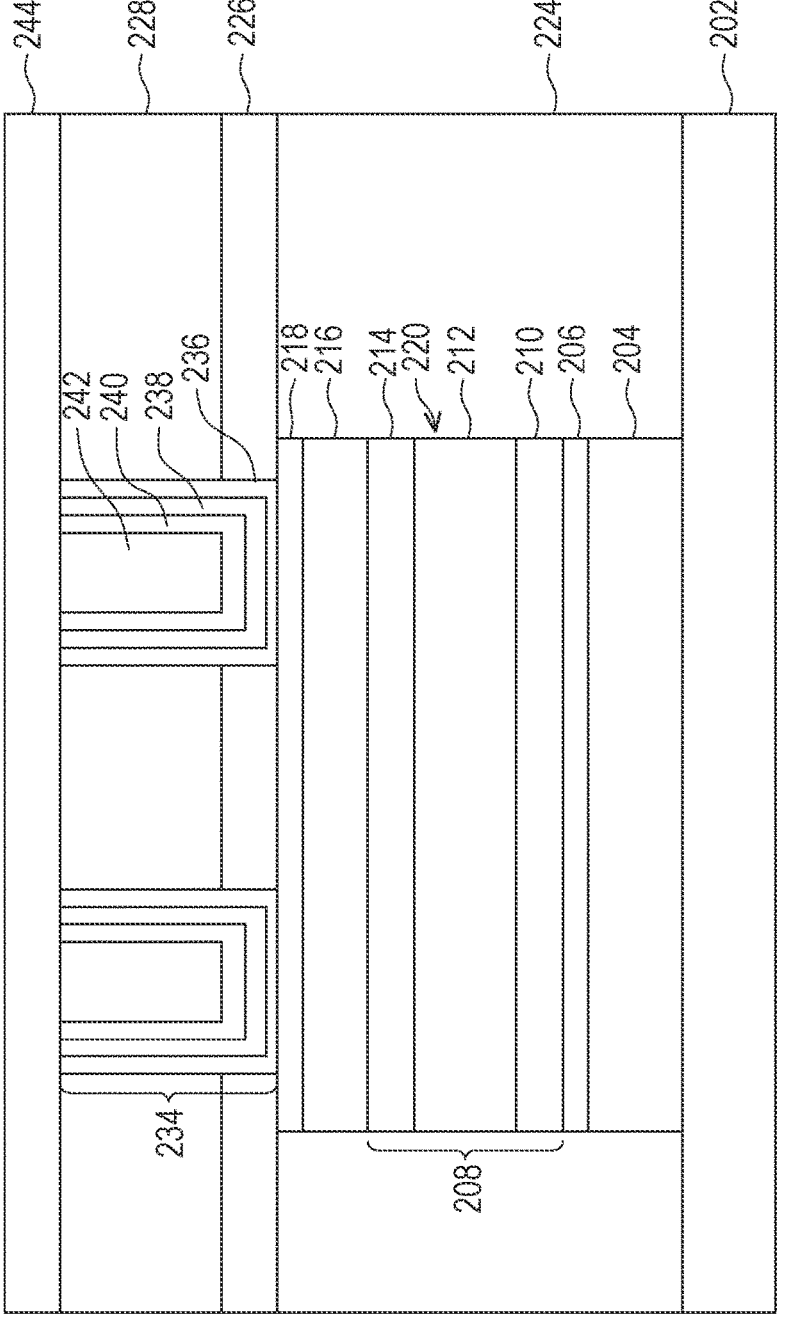
Figure 17:
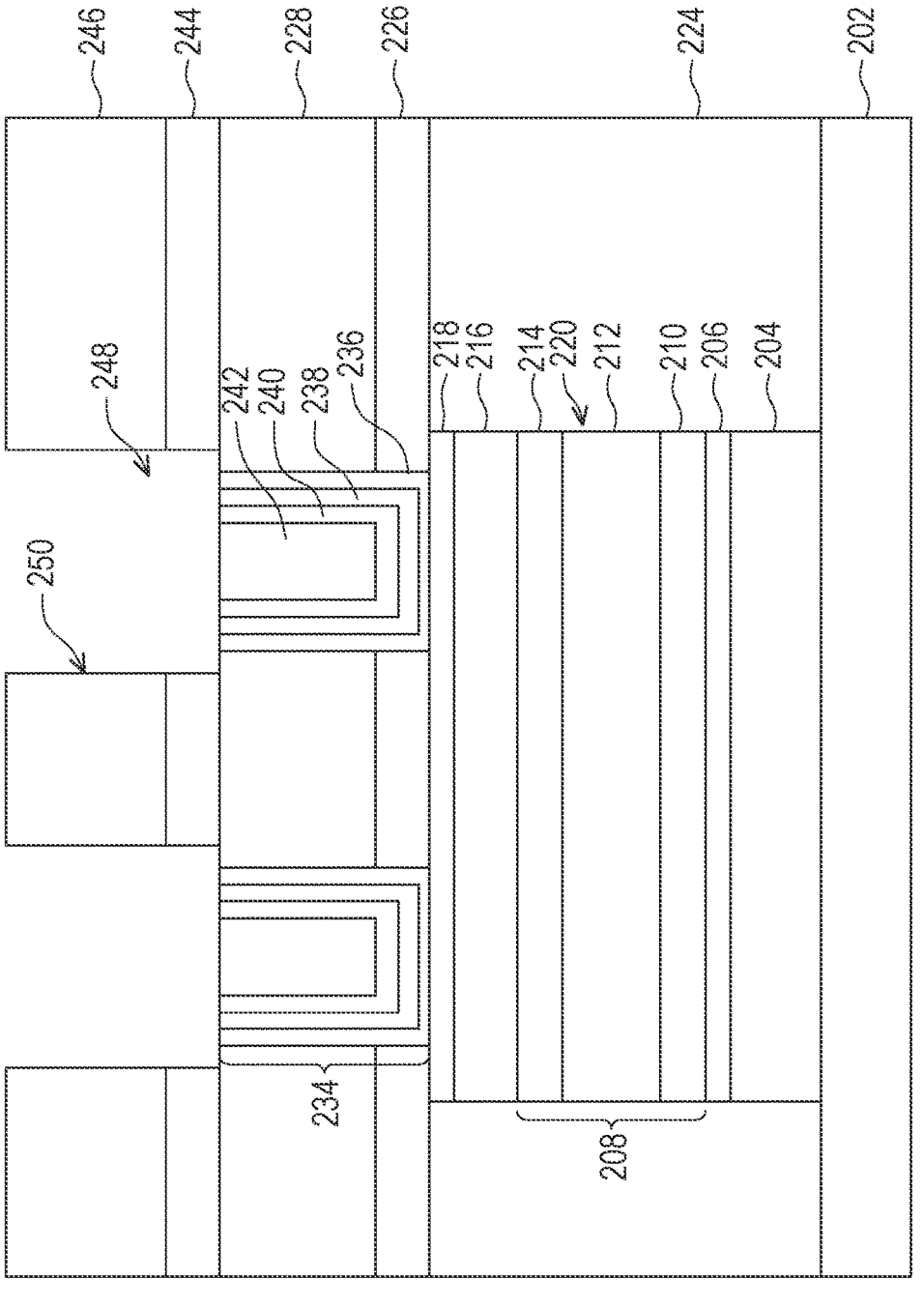
Figure 18:
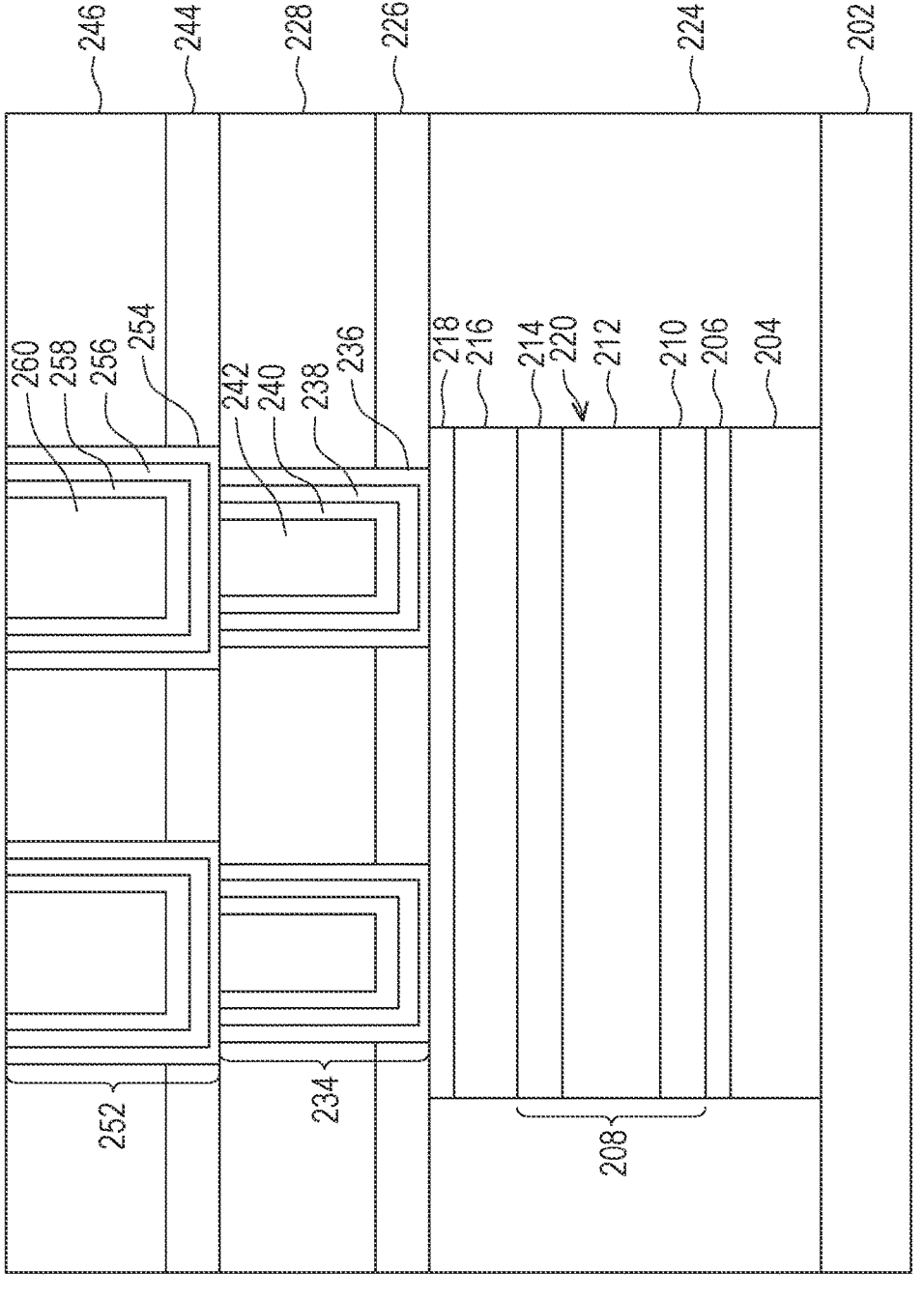
FIG. 18 schematically illustrates a semiconductor device according to some embodiments of the present disclosure.

As shown in FIGS. 16-18, at block 122, of the method 100, manufacturing steps associated with blocks 116, 118, and 120 are repeated. For example, one or more interconnect layers may be formed on the semiconductor device 200.

As shown in FIG. 16, a second dielectric layer 244 is formed over the first S/D contact structure 234 and the second ILD layer 228. The second dielectric layer 244 may be in contact with a surface (e.g., a top surface) of the first S/D contact structure 234 and/or the second ILD layer 228. As shown in FIG. 17, a third ILD layer 246 is formed. For example, the third ILD layer 246 may be formed over the second dielectric layer 244 and/or over the first S/D contact structure 234. For example, the third ILD layer 246 may be in contact with a surface (e.g., a top surface) of the second dielectric layer 244. The second dielectric layer 244 may be formed using the same or similar techniques, and may include the same or similar composition, as described above for the first dielectric layer 226.

After the third ILD layer 246 is formed, one or more layers of the semiconductor device 200 may be patterned to form a second S/D contact region 248. For example, the second S/D contact region 248 may include a first recess (e.g., a first trench) and a second recess (e.g., a second trench), as shown in FIG. 17. The second S/D contact region 248 may include surfaces 250 (e.g., a first (right) sidewall, a second (left) sidewall that is opposite the first sidewall (e.g., facing away from the first sidewall), and/or a bottom wall). For example, a volume of the second S/D contact region 248 may be defined between the first and second sidewalls and over the bottom wall. The second S/D contact region 248 may extend to and/or within the first S/D contact structure 234. The second dielectric layer 244 may be patterned so that the bottom wall of the second S/D contact region 248 is defined by the first S/D contact structure 234. For example, the second S/D contact region 248 may extend to the first S/D contact structure 234 (e.g., to the top of the first S/D contact structure 234, as described above), without extending into the first S/D contact structure 234. For example, the depth of the second S/D contact region 248 may correspond to a combined depth of the third ILD layer 246 and the second dielectric layer 244.

As shown in FIG. 18, a source contact and a drain contact (collectively, second S/D contact structure 252) are formed in the second dielectric layer 244. For example, the second S/D contact structure 252 may be defined by the surfaces 250 of the second S/D contact region 248. The source contact and the drain contact may be formed in contact with the first S/D contact structure 234. A first conductive layer 254 may be formed over the top surface of the first S/D contact structure 234. For example, the first conductive layer 254 may be in contact with the first sidewall, the second sidewall, and the bottom wall (e.g., corresponding to the top surface of the first S/D contact structure 234) of the second S/D contact region 248. A second conductive layer 256 may be formed over the first conductive layer 254. For example, the second conductive layer 256 may be in contact with one or more surfaces (e.g., a first (right) sidewall, a second (left) sidewall that is opposite the first sidewall (e.g., facing towards the first sidewall), and/or a top wall) of the first conductive layer 254. A third conductive layer 258 may be formed over the second conductive layer 256. For example, the third conductive layer 258 may be in contact with one or more surfaces (e.g., a first (right) sidewall, a second (left) sidewall that is opposite the first sidewall (e.g., facing towards the first sidewall), and/or a top wall) of the second conductive layer 256. A conductive fill layer 260 may be formed over the third conductive layer 258. For example, the conductive fill layer 260 may be in contact with one or more surfaces (e.g., a first (right) sidewall, a second (left) sidewall that is opposite the first sidewall (e.g., facing towards the first sidewall), and/or a top wall) of the third conductive layer 258. The second S/D contact structure 252 may be formed using the same or similar techniques, and may include the same or similar composition, as described above for the first S/D contact structure 234.

After forming the second S/D contact structure 252, manufacturing steps associated with blocks 116, 118, and 120 may be repeated to form one or more additional conductive contact layers on the semiconductor device 200.

It will be understood that not all advantages have been necessarily discussed herein, no particular advantage is required for all embodiments or examples, and other embodiments or examples may offer different advantages.

Some embodiments of the present provide a method that includes forming a gate electrode over a substrate; forming a ferroelectric layer over the gate electrode; forming a channel layer over the ferroelectric layer; forming a capping layer over the channel layer, wherein the capping layer includes one or more of $CeO_x$, $BeO_x$, $InO_x$, $GaO_x$, $AlO_x$, $SnO_x$, $VO_x$, $WO_x$, $TiO_x$, $ZrO_x$, $NbO_x$, $HfO_x$, $SiO_x$, $TaO_x$, a binary metal oxide based on any combination of the preceding metal oxides, or a ternary metal oxide based on any combination of the preceding metal oxides; annealing, after forming the capping layer, at a temperature less than 350° C.; forming a dielectric layer over the capping layer; and forming a source contact and a drain contact in the dielectric layer.

Some embodiments of the present disclosure provide a ferroelectric random access memory (FeRAM) device that includes a transistor, including: a gate electrode; a ferroelectric layer over the gate electrode; a channel layer over the ferroelectric layer; a capping layer over the channel layer, wherein the capping layer includes one or more of $CeO_x$, $BeO_x$, $InO_x$, $GaO_x$, $AlO_x$, $SnO_x$, $VO_x$, $WO_x$, $TiO_x$, $ZrO_x$, $NbO_x$, $HfO_x$, $SiO_x$, $TaO_x$, a binary metal oxide based on any combination of the preceding metal oxides, or a ternary metal oxide based on any combination of the preceding metal oxides; a dielectric layer over the capping layer; and a source and a drain contacting one or more of the capping layer, the channel layer, or the ferroelectric layer.

Some embodiments of the present disclosure provide a method that includes forming a gate electrode over a substrate; forming a ferroelectric layer, over the gate electrode, including: forming a seed layer over the gate electrode; forming a memory layer over the seed layer; and forming an interfacial layer over the memory layer; forming a channel layer over the interfacial layer; forming a capping layer over the channel layer; forming a dielectric layer over the capping layer; patterning the dielectric layer; and forming a source contact and a drain contact, in the patterned dielectric layer, including: forming a first conductive layer; forming a second conductive layer over the first conductive layer; forming a third conductive layer over the second conductive layer; and forming a conductive fill layer over the third conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:

forming a gate electrode over a substrate;

forming a ferroelectric layer over the gate electrode;

forming a channel layer over the ferroelectric layer;

forming a capping layer over the channel layer, wherein the capping layer includes one or more of $TaO_x$, a binary metal oxide based on $TaO_x$, or a ternary metal oxide based on $TaO_x$;

annealing, after forming the capping layer and before forming any subsequent layer, at a temperature less than 350° C.;

forming a dielectric layer over the capping layer; and forming a source contact and a drain contact in the dielectric layer.

2. The method of claim 1, wherein forming the source contact and the drain contact comprises:

patterning the dielectric layer; and forming the source contact and the drain contact in contact with the capping layer.

3. The method of claim 1, wherein forming the source contact and the drain contact comprises:

patterning the dielectric layer and the capping layer; and forming the source contact and the drain contact in contact with the channel layer, wherein the channel layer includes one or more of InGaZnO, InO, ITO, GaZnO, InGaAs, GaN, AlGaAs, Si, Ge, C, SiC, SiGe, SiGeC, $Ga_2O_3$, a II-VI compound semiconductor, or a III-V compound semiconductor.

4. The method of claim 1, wherein forming the source contact and the drain contact comprises:

patterning the dielectric layer, the capping layer, and the channel layer; and forming the source contact and the drain contact in contact with the ferroelectric layer.

5. The method of claim 1, wherein forming the ferroelectric layer comprises:

forming a seed layer over the gate electrode, wherein the seed layer includes one or more of $Ta_2O_5$, $ZrO_2$, or $HfO_2$;

forming a memory layer over the seed layer, wherein the memory layer includes one or more of hafnium zirconium oxide or $HfO_2$ that is doped with one or more of Ta, Al, Si, In, Zr, Sc, Y, Gd, La, Sr; and forming an interfacial layer over the memory layer, wherein the interfacial layer includes one or more of $TiO_2$, $Ta_2O_5$, BaO, SrO, $Y_2O_3$, $HfO_2$, $ZrO_2$, or $HfSiO_2$.

6. The method of claim 1, further comprising:

annealing, after forming the ferroelectric layer and before forming the channel layer, at a temperature less than 350° C.

7. The method of claim 1, wherein forming the source contact and the drain contact comprises:

forming a first conductive layer, wherein the first conductive layer includes one or more of TiN, TaN, or WN;

forming a second conductive layer over the first conductive layer, wherein the second conductive layer includes one or more of Ti, Zr, Th, V, Pd, Cu, or W;

forming a third conductive layer over the second conductive layer, wherein the third conductive layer includes one or more of TiN, TaN, or WN; and forming a conductive fill layer over the third conductive layer, wherein the conductive fill layer includes one or more of Ru, Al, Pt, Ag, Co, Fe, Sn, or Ni.

8. The method of claim 1, wherein the dielectric layer comprises one or more of $AlO_x$, $SiN_x$, TiC, or $TiO_2$.

9. The method of claim 1, wherein forming the capping layer comprises using:

physical vapor deposition;

plasma enhanced chemical vapor deposition; or plasma enhanced atomic layer deposition.

10. The method of claim 1, wherein the dielectric layer is a first dielectric layer, the source contact is a first source contact, and the drain contact is a first drain contact, further comprising:

forming a second dielectric layer over the first source contact and the first drain contact; and forming a second source contact and a second drain contact in the second dielectric layer.

11. A ferroelectric random access memory (FeRAM) device, comprising:

a transistor, comprising:

a gate electrode;

a ferroelectric layer over the gate electrode;

a channel layer over the ferroelectric layer;

a capping layer over the channel layer, wherein the capping layer includes one or more of $TaO_x$, a binary metal oxide based on $TaO_x$, or a ternary metal oxide based on $TaO_x$;

a dielectric layer over the capping layer; and a source and a drain contacting one or more of the capping layer, the channel layer, or the ferroelectric layer.

12. The device of claim 11, wherein the source and the drain are in contact with a top surface of the capping layer.

13. The device of claim 11, wherein the source and the drain are in contact with a top surface of the channel layer, wherein the channel layer includes one or more of InGaZnO, InO, ITO, GaZnO, InGaAs, GaN, AlGaAs, Si, Ge, C, SiC, SiGe, SiGeC, $Ga_2O_3$, a II-VI compound semiconductor, or a III-V compound semiconductor.

14. The device of claim 11, wherein the source and the drain are in contact with a top surface of the ferroelectric layer.

15. The device of claim 11, wherein the ferroelectric layer comprises:

a seed layer over the gate electrode, wherein the seed layer includes one or more of $Ta_2O_5$, $ZrO_2$, or $HfO_2$;

a memory layer over the seed layer, wherein the memory layer includes one or more of hafnium zirconium oxide or $HfO_2$ that is doped with one or more of Ta, Al, Si, In, Zr, Sc, Y, Gd, La, Sr; and an interfacial layer over the memory layer, wherein the interfacial layer includes one or more of $TiO_2$, $Ta_2O_5$, BaO, SrO, $Y_2O_3$, $HfO_2$, $ZrO_2$, or $HfSiO_2$.

16. The method of claim 11, wherein the capping layer is a single layer.

17. A method, comprising:

forming a gate electrode over a substrate;

forming a ferroelectric layer, over the gate electrode, comprising:

forming a seed layer over the gate electrode;

forming a memory layer over the seed layer; and forming an interfacial layer over the memory layer;

forming a channel layer over the interfacial layer;

forming a capping layer over the channel layer, wherein the capping layer includes one or more of $TaO_x$, a binary metal oxide based on $TaO_x$, or a ternary metal oxide based on $TaO_x$;

forming a dielectric layer on a top surface of the capping layer across a width of the capping layer;

patterning the dielectric layer; and forming a source contact and a drain contact, in the patterned dielectric layer, comprising:

forming a first conductive layer;

forming a second conductive layer over the first conductive layer;

forming a third conductive layer over the second conductive layer; and forming a conductive fill layer over the third conductive layer.

18. The method of claim 17, wherein the seed layer includes one or more of $Ta_2O_5$, $ZrO_2$, or $HfO_2$, wherein the memory layer includes one or more of hafnium zirconium oxide or $HfO_2$ that is doped with one or more of Ta, Al, Si, In, Zr, Sc, Y, Gd, La, Sr, and wherein the interfacial layer includes one or more of $TiO_2$, $Ta_2O_5$, BaO, SrO, $Y_2O_3$, $HfO_2$, $ZrO_2$, or $HfSiO_2$.

19. The method of claim 17, wherein the first conductive layer includes one or more of TiN, TaN, or WN, wherein the second conductive layer includes one or more of Ti, Zr, Th, V, Pd, Cu, or W, wherein the third conductive layer includes one or more of TiN, TaN, or WN, and wherein the conductive fill layer includes one or more of Ru, Al, Pt, Ag, Co, Fe, Sn, or Ni.

20. The method of claim 17, further comprising:

annealing, after forming the capping layer, at a temperature less than 350° C.

* * * * *